United States Patent
Lin et al.

(10) Patent No.: US 10,916,499 B2
(45) Date of Patent: Feb. 9, 2021

(54) VIAS AND GAPS IN SEMICONDUCTOR INTERCONNECTS

(71) Applicant: Intel Corporation, Santa Clara, CA (US)

(72) Inventors: Kevin Lin, Beaverton, OR (US); Manish Chandhok, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/337,889

(22) PCT Filed: Sep. 30, 2016

(86) PCT No.: PCT/US2016/054818
§ 371 (c)(1),
(2) Date: Mar. 28, 2019

(87) PCT Pub. No.: WO2018/063337
PCT Pub. Date: Apr. 5, 2018

(65) Prior Publication Data
US 2020/0027827 A1 Jan. 23, 2020

(51) Int. Cl.
*H01L 23/52* (2006.01)
*H01L 23/522* (2006.01)
(Continued)

(52) U.S. Cl.
CPC ...... *H01L 23/5226* (2013.01); *H01L 21/7682* (2013.01); *H01L 21/76807* (2013.01);
(Continued)

(58) Field of Classification Search
CPC ........... H01L 21/76897; H01L 21/7682; H01L 21/76807; H01L 23/5226; H01L 23/528; H01L 23/5329
See application file for complete search history.

(56) References Cited

U.S. PATENT DOCUMENTS 7,772,706 B2 * 8/2010 Balakrishnan .... H01L 21/76807
257/410
9,230,911 B2 * 1/2016 Tsai ................... H01L 23/5329
(Continued)

OTHER PUBLICATIONS

International Search Report and Written Opinion for PCT Application No. PCT/US2016/054818, dated Jun. 28, 2017, 13 pages.

*Primary Examiner* — Luan C Thai
(74) *Attorney, Agent, or Firm* — Green, Howard & Mughal LLP

(57) ABSTRACT

Systems and methods for maskless gap (for example, air gap) integration into multilayer interconnects having one or more interconnect lines (for example, metal interconnect lines) embedded in a dielectric layer of the interconnects are described. In various embodiments, the described systems and methods may serve to reduce electrical shorting between adjacent vias in the interconnects. In one embodiment, a spacer layer may be provided to mask portions of an interlayer dielectric (ILD) in the interconnect. These masked portions of the ILD can protect regions between adjacent interconnect lines (for example, metal interconnect lines) from electrical shorting during subsequent metal layer depositions, for example, during a fabrication sequence of the interconnects. Further, the vias may enclose a gap (for example, an air gap) without the need for additional masking steps. Further, such gaps may be inherently self-aligned to the vias and/or spacer layers. Moreover, the gaps may act to reduce capacitance and thereby increase the performance (circuit timing, power consumption, etc.) of the interconnect.

16 Claims, 32 Drawing Sheets

(51) Int. Cl.
*H01L 21/768* (2006.01)
*H01L 23/528* (2006.01)
*H01L 23/532* (2006.01)

(52) U.S. Cl.
CPC ...... *H01L 21/76897* (2013.01); *H01L 23/528* (2013.01); *H01L 23/5329* (2013.01); *H01L 2221/1026* (2013.01)

(56) References Cited

U.S. PATENT DOCUMENTS

| | | | |
|---|---|---|---|
| 9,349,687 | B1 | 5/2016 | Gates et al. |
| 9,390,965 | B2 * | 7/2016 | Yang ................. H01L 21/76807 |
| 9,431,294 | B2 * | 8/2016 | He ..................... H01L 21/7682 |
| 9,613,851 | B2 * | 4/2017 | Nitta ................. H01L 21/76808 |
| 2009/0166881 | A1 | 7/2009 | Balakrishnan et al. |
| 2014/0284813 | A1 | 9/2014 | Greco et al. |
| 2015/0179499 | A1 | 6/2015 | Yang et al. |
| 2015/0187696 | A1 | 7/2015 | Tsai et al. |
| 2015/0287628 | A1 | 10/2015 | You et al. |
| 2016/0027686 | A1 | 1/2016 | Nitta et al. |
| 2016/0118292 | A1 | 4/2016 | He et al. |

\* cited by examiner

VIAS AND GAPS IN SEMICONDUCTOR INTERCONNECTS

CROSS-REFERENCE TO RELATED APPLICATION(S)

This application is a U.S. National Stage Application under 35 U.S.C. 371 and claims the priority benefit of PCT International Application No. PCT/US2016/054818, filed Sep. 30, 2016, the disclosure of which is incorporated herein by reference as if set forth in full.

TECHNICAL FIELD

This disclosure generally relates to interconnects, and more particularly to vias and gaps in semiconductor interconnects.

BACKGROUND

Integrated circuits and other electronic devices may be integrated onto an electronic system, such as a consumer electronic system. The integrated circuit and electronic devices may include any number of interconnects including metallic signal traces that can route signals.

BRIEF DESCRIPTION OF THE FIGURES

Reference will now be made to the accompanying drawings, which are not necessarily drawn to scale, and wherein.

DETAILED DESCRIPTION

Figures 1A, 1B:
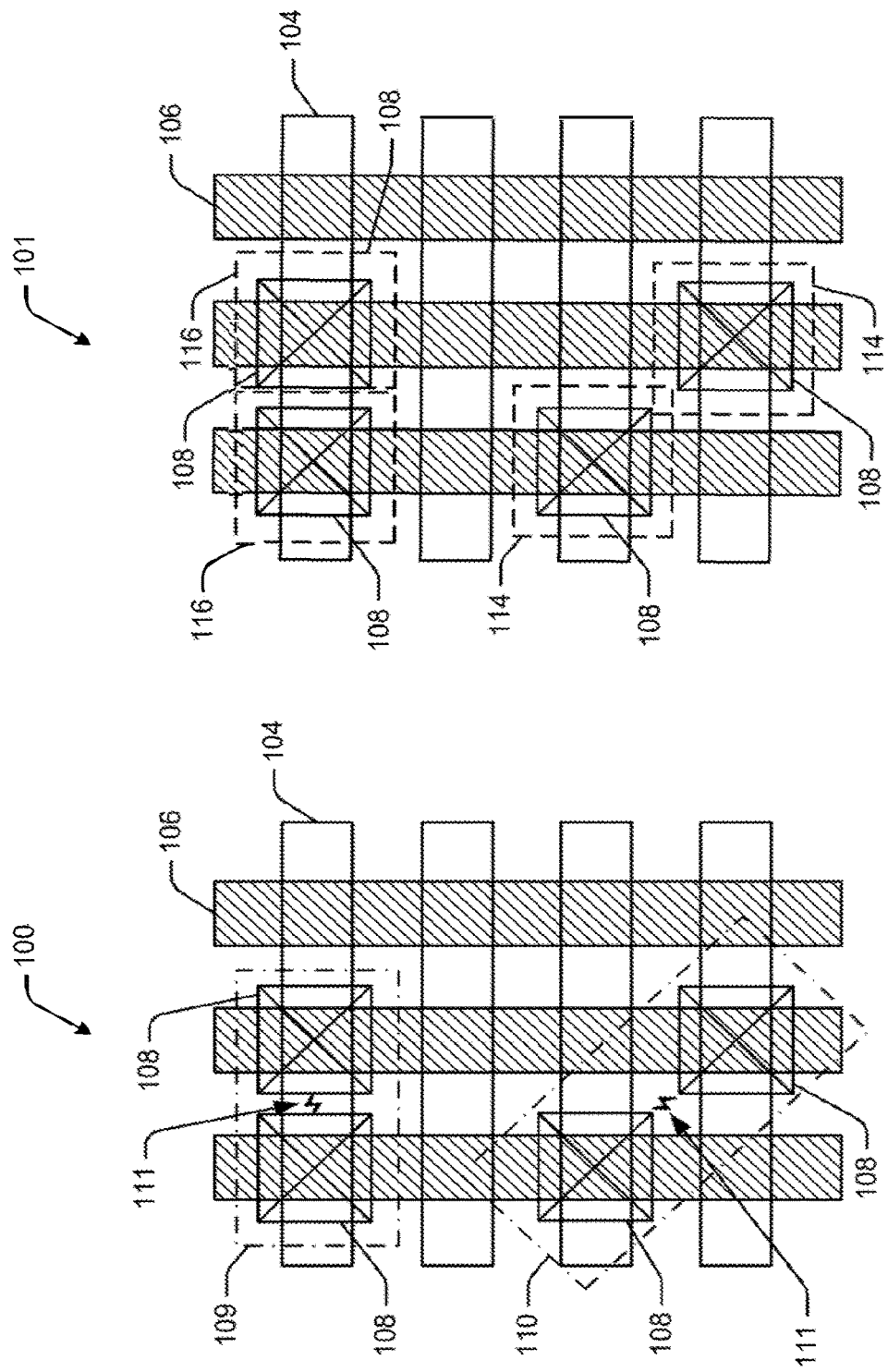
FIGS. 1A-1B shows an example top down view of an example interconnect having vias in accordance with example embodiments of the disclosure.

Embodiments of the disclosure are described more fully hereinafter with reference to the accompanying drawings, in which embodiments of the disclosure are shown. This disclosure may, however, be embodied in many different forms and should not be construed as limited to the embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (for example, surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane, where the horizontal plane can include an x-y plane, a x-z plane, or a y-z plane, as the case may be. The term "processing" as used herein includes deposition of material or photoresist, patterning, exposure, development, etching, cleaning, ablating, polishing, and/or removal of the material or photoresist as required in forming a described structure.

In various embodiments of this disclosure, systems and methods described are directed to maskless gap (for example, air gap) integration into multilayer interconnects having one or more lines (for example, metal interconnect lines) embedded in a dielectric layer of the interconnects with respect to a plane defined by the wafer on which the interconnects are fabricated. In various embodiments, as described herein, a via (also referred to as vertical interconnect access) can be an electrical connection between layers in the interconnect that goes through a plane (for example, an x-y plane) of one or more adjacent layers. In various embodiments, the systems and methods described in the disclosure may serve to reduce electrical shorting between adjacent vias in the interconnects. In one embodiment, a spacer layer may be provided to mask portions of an interlayer dielectric (ILD) in the interconnect. These masked portions of the ILD can protect regions between adjacent interconnect lines (for example, metal interconnect lines) from electrical shorting during subsequent metal layer depositions during a fabrication sequence of the interconnects. Further, as is described in greater detail below, the vias may enclose a gap (for example, an air gap) without the need for additional masking steps. Such gaps may be inherently self-aligned to the vias and/or spacer layers (e.g., the gaps may have a predetermined offset between the gaps and the one or more vias and/or spacer layers). Moreover, the gaps may act to reduce capacitance, and thereby increase performance (circuit timing, power consumption, etc.) of the interconnects.

In one embodiment, the interconnects can form a portion of a back-end interconnect, which can be part of a structure including a wafer (for example, silicon, Si), one or more transistors, and/or a backend interconnect. In one embodiment, the interconnects described herein can include multiple layers, for example, approximately 2 layers to approximately 100 layers. However, it may be appreciated that the systems and methods disclosed herein in connection with the interconnects may not be limited to any predetermined number of layers. In one embodiment, the layers of an interconnect may include metal layers, dialectic layers, interlayer dielectric layers and/or vias.

In various embodiments used in connection with the systems and methods of the disclosure, the vias may comprise approximately 5% to approximately 20% of the total area of the metal interconnect lines of the interconnects. The various embodiments disclosed herein can apply to approximately 14 nanometer processing technology. However it can be understood and it is noted that the disclosure can be used in connection with any other processing technology, for example, approximately 1 nanometer to approximately 1,000 nanometer processing technologies.

FIGS. 1A-1B illustrates a top-down view of an example interconnect having vias in accordance with embodiments of the disclosure. Although an interconnect 100 is shown in FIG. 1A, the disclosure is not limited in that respect and the systems and methods disclosed herein can apply to a multilayer interconnect, such as an N-layer interconnect, where N is any positive integer. The interconnect 100 can include a first interconnect line 104 (for example, a metal interconnect line) and a second interconnect line 106 (for example, a metal interconnect line). In one embodiment, the first interconnect line 104 may be positioned above the second interconnect line 106 with reference to the Z-axis. In other embodiments, the second interconnect line 106 may be positioned above the first interconnect line 104 with reference to the Z-axis.

In one embodiment, the interconnect 100 can include one or more vias 108. A subset of the one or more vias 108 may be adjacent to one another in the horizontal (or vertical) direction with respect to the x-y axis, for example, as shown in adjacent via group 109. Also, for example, a portion of these vias 108 may be adjacent to one another in the x-y (e.g. diagonal) direction, as shown in an adjacent vias group 110. One issue that may arise with the one or more vias 108 of the interconnect 100 can be the formation of electrical shorts 111 in adjacent via groups, for example, adjacent via groups 109 and/or 110. The electrical shorts 111, may occur as a result of at least two interconnect lines (for example, the first line 104 and the second line 106) making physical contact with one another as a result of or during one or more processing steps used in the formation of the interconnect 100. That is, in one aspect, various factors, including, but not limited to, inaccuracies in masking, and/or diffusion of metal during the processing steps may cause metal shorts 111 to occur between adjacent interconnect lines at adjacent via group locations on the interconnect 100. The formation of the short can be detrimental to the performance of interconnects, for example, by preventing the transmission of various electronic signals between one or more transistors of a chip and/or die that makes use of the interconnect. Accordingly, in some embodiments, the systems and methods described herein are directed towards the prevention of the formation of such shorts, for example, by using a spacer layer (to be shown and discussed below) to provide additional ILD material between adjacent interconnect lines and thereby physically impede the formation of the shorts.

Furthermore, as described in more detail below, the vias, such as the one or more vias 108, may further enclose a gap (not shown in FIG. 1A, which is a top-down view of the interconnect, but see for example, FIGS. 2A-2D and FIGS. 3A-3J and FIGS. 4A-4M and relevant description), for example, an air gap. Such gaps may reduce capacitance and thereby increase performance (for example, circuit timing, power consumption, and the like) of the interconnect 101. In various embodiments, the gaps may be filled at least partially with air, but may additionally (or alternatively) include any other gas (for example, nitrogen, helium, hydrogen, xenon, inert gasses, and so on), liquids, and/or dielectrics (for example, low-K dielectrics). In one embodiment, such low-K dielectrics may be lower dielectric constant with respect to other IDLs within the interconnect.

FIG. 1B illustrates another top-down view of the example interconnect 101, further showing one or more masks that may be used in the fabrication of the interconnect 101, in accordance with one or more embodiments of the disclosure. FIG. 1B illustrates the first interconnect line 104 and the second interconnect line 106, in addition to a one or more vias, 108. In one embodiment, adjacent vias (such as vias 109 and/or the group of vias 110, an/or diagonally adjacent vias 110 as shown in FIG. 1A) may be protected from potential shorts (for example, such as the shorts depicted in the metal shorts 111 of FIG. 1A) by using one or more masks such as the mask 114 and mask 116. As such, the diagram of FIG. 1B shows the use of such masks to reduce the occurrence of metal shorts.

FIGS. 2A-2F show diagrams representing a processing sequence for the fabrication of an interconnect with gaps in accordance with one or more embodiments of the disclosure. The structures shown in FIGS. 2A-2D can represent a portion of the interconnect. It can be understood that the structure can be repeated in the x and/or y direction (with respect to the axis drawn) to produce a periodic (or semi-periodic structure).

Although an interconnect structure can be formed by the processing sequence disclosed herein, the same processing sequence, or at least some stages thereof, can be used in combination with one or more processing stages to produce a multilayer interconnect having any number of layers. For example, an interconnect having N layers where N is a positive integer.

Figure 2A:
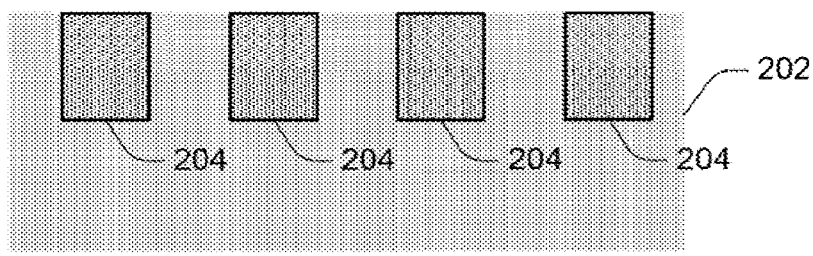
FIGS. 2A-2F illustrate an example process flow or the fabrication of the interconnects in accordance with one or more example embodiments of the disclosure.
Figure 2A:
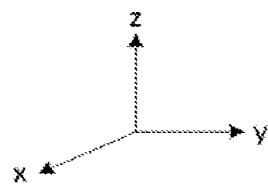

In particular, FIG. 2A illustrates an example cross-sectional view of an intermediate result of a processing sequence for the fabrication of a portion of an interconnect with gaps in accordance with one or more embodiments of the disclosure.

In one embodiment, the interconnect 201 can include a first ILD 202. The first ILD 202 may be a permanent and/or a non-conformal dielectric layer. The first ILD 202 may be deposited via any suitable mechanism, including but not limited to, chemical vapor deposition (CVD), physical evaporation chemical vapor deposition (PECVD) and/or by spin coating. The first ILD 202 can have any suitable thickness, for example, the first ILD 202 can have a thickness of approximately 5 nm to approximately 1000 nm with an example thickness of 30 nm to approximately 60 nm.

The interconnect 201 can further include one or more interconnect lines (for example, one or more metal interconnect lines) 204. The one or more interconnect lines 204 can first be formed by producing or by fabricating a trench in the first ILD 202 at the locations where the one or more vias are to be formed (not shown). In a subsequent step the trenches can be filled with metal. In one embodiment, the one or more interconnect lines 204 may be similar but not identical to a portion of the first interconnect line 104 and/or the second interconnect line 106 as shown in FIG. 1B.

Figure 2B:
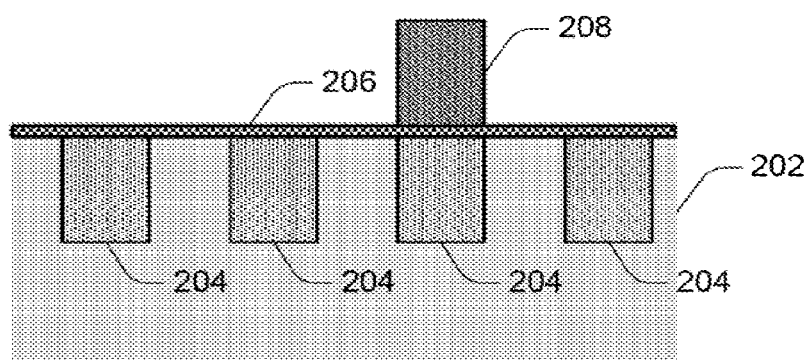

FIG. 2B illustrates an example cross-sectional view of an intermediate result of the processing sequence for the fabrication of a portion of the interconnect in accordance with one or more embodiments of the disclosure. In one embodiment, the interconnect 203 can include the first ILD 202. The interconnect 203 can further include one or more interconnect lines 204 that may be formed in the first ILD 203. The one or more interconnect lines 204 may be similar, but not identical, to a portion of the first interconnect line 104 and/or the second interconnect line 106 of FIG. 1B.

The interconnect 203 can further include an etch stop layer 206, that is disposed above the first ILD 202 and the one or more interconnect lines 204. The etch stop layer can be used to seal the underlying layers (for example, the plurality of interconnect lines 204 and/or the first ILD 202). The etch stop layer 206 may further prevent the interdiffusion of metal (for example, metal from the one or more interconnect lines 204) and/or any other materials in proximate layers or in preceding steps or following steps in the processing sequence of the interconnect 203. In various embodiments the etch stop layer 206 can include a silicon nitride (SiN) material.

In one embodiment, the interconnect 203 can further include a sacrificial member 208, that is disposed above the etch stop layer 206. The sacrificial member 208 may act as a temporary placeholder for a via that will be formed in further processing steps (to be discussed below). In one embodiment the sacrificial member 208 can include a titanium nitride (TiN) material. The sacrificial member 208 can further include any sacrificial conductive and/or nonconductive material including, but not limited to, amorphous silicon, any metal oxide, and/or titanium nitride (TiN), and/or titanium (Ti). In one embodiment, the sacrificial member 208 can be formed by any suitable method including, but not limited to, chemical vapor deposition (CVD) and/or plasma enhanced chemical vapor deposition (PECVD). In one embodiment, the sacrificial member 208 can be patterned using a mask during the deposition of the sacrificial member 208. In another embodiment, the sacrificial via 208 can be etch-selective to the first ILD 202 etching. In one embodiment, the sacrificial member 208 can prevent punch-through to the metal layers in one or more interconnect lines 204 below, for example, during a via etching step to be described below.

Figure 2C:
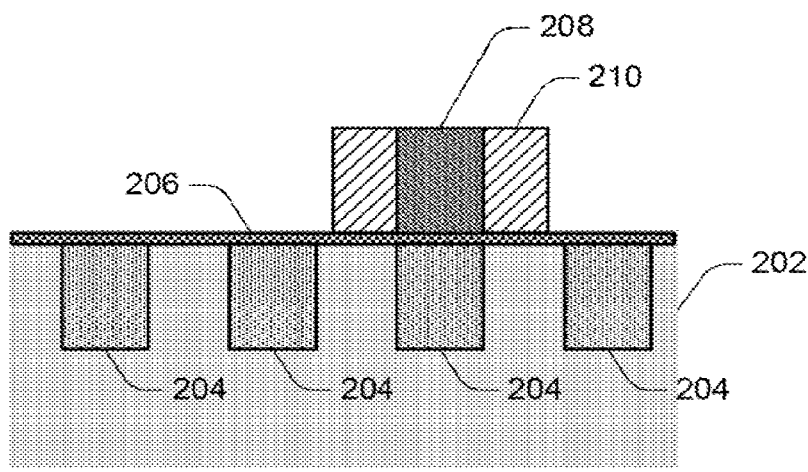

FIG. 2C illustrates an example cross-sectional view of an intermediate result of the processing sequence for the fabrication of a portion of the interconnect in accordance with one or more embodiments of the disclosure. The interconnect 205 can include a first ILD 202. The interconnect 205 can further include one or more interconnect lines (for example, one or more metal interconnect lines) 204 that may be formed in the first ILD 202. The interconnect 205 can further include an etch stop layer 206, that may be disposed above the first ILD and the one or more interconnect lines 204. The interconnect 205 can further include a sacrificial member 208, that is disposed above the etch stop layer 206.

In one embodiment, the interconnect 205 can further include a spacer layer 210. In another embodiment, the spacer layer 210 can be used to mask the underlying layers (for example, a portion of the etch stop layer 206, a portion of the one or more interconnect lines 204, and a portion of the first ILD 202) during subsequent etching steps (discussed below) in the processing sequence for the fabrication of the interconnect. In one embodiment, the spacer layer 210 can be a non-conductive material. In another embodiment the spacer layer 210 can include a permanent (for example non-sacrificial) material. In another embodiment the sacrificial member 208 can be set etch selective to the first ILD 202 in one embodiment. The sacrificial member 208 can be deposited by any suitable process including, but not limited to, CVD, PECVD and/or atomic-layer deposition (ALD). In one embodiment, the thickness (that is, width) of the spacer layer 210 can be greater than or equal to approximately one-half the thickness of the spacing between adjacent interconnect lines in the one or more interconnect lines 204.

In one embodiment the spacer layer can include a metal oxide material, for example, a silicon dioxide material $SiO_2$. In another embodiment, the spacer layer 210 and may be conformal to facilitate deposition around the tight-pitch topography of the underlying layers.

The spacer layer 210 allows for the masking of regions (for example, regions encompassing the first ILD 202) that can act as a buffer material between the adjacent interconnect lines 204 of the interconnect, and physically impede the interconnect lines from making electrical contact with one another upon the deposition of a metal layer (for example, the metal layer 218 shown and discussed below in connection with FIG. 2F) in a future processing step. Additionally, the spacer layer 210 does not additionally cover the sacrificial member 208, thereby allowing one or more vias to electrically contact a second metal layer (for example, one or more vias 208b making electrical connection to a second metal layer 218 as shown and described in connection with FIG. 2F). In one embodiment, the spacer layer 210 is sized so as to allow for the formation of one or more gaps (for example, one or more gaps 212 shown and described in connection with FIG. 2D) in the interconnect, for example, in regions that are not as susceptible to short formation (for example, because they are masked and protected by a second ILD, for example, a second ILD 214 shown and described in connection with FIG. 2D). In one embodiment, the horizontal dimensions of the spacer layer 210 may not extend past the outmost edge of an adjacent metal interconnect line, like what is shown in FIG. 2C. Alternatively or additionally, the horizontal dimensions of the spacer layer 210 may extend past the outmost edge of an adjacent metal interconnect line, unlike what is shown in FIG. 2C. These differences may or may not be intentional, and may be the result of inherent misalignments during the course of one or more processing steps. Further, it can be understood that the dimensions of the spacer layer 210 or any other layer in this or any other figure shown herein are not necessarily drawn to scale.

Figure 2D:
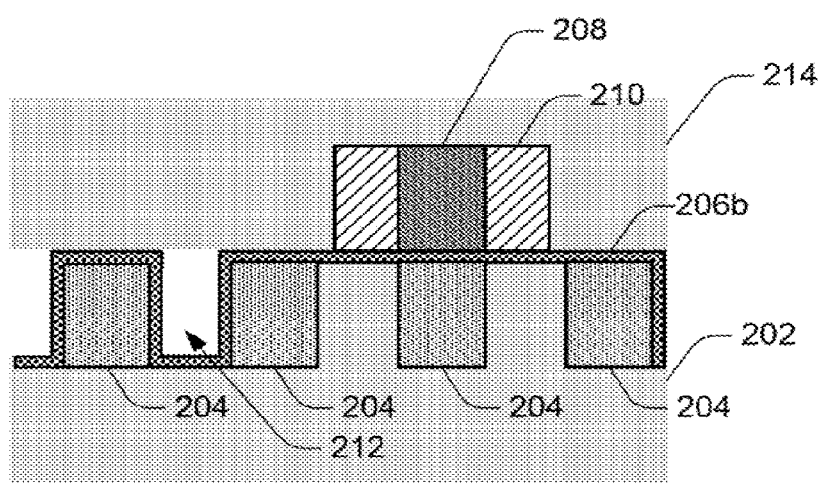

FIG. 2D illustrates an example cross-sectional view of an intermediate result of the processing sequence for the fabrication of a portion of the interconnect in accordance with one or more embodiments of the disclosure. The interconnect 207 can include a first ILD 202. The interconnect 207 can further include one or more interconnect lines (for example, one or more metal interconnect lines) 204, which may be formed in the first ILD 202. The one or more interconnect lines 204 may be similar, but not identical, to a portion of the first interconnect line 104 and/or the second interconnect line 106 of FIG. 1B.

The interconnect 207 can further include a second etch stop layer 206b, that may be disposed above the first ILD 202 and the one or more interconnect lines 204. The interconnect 207 can further include a sacrificial member 208 that is disposed above or onto the second etch stop layer 206b. The interconnect 207 can further include a spacer layer 210, which may be disposed also above the second etch stop layer 206b and the first ILD 202 and the one or more interconnect lines 204. In another embodiment, the spacer layer 210 can be used to mask the underlying layers (for example, a portion of the second etch stop layer 206b, a portion of the one or more interconnect lines 204, and a portion of the first ILD 202) during subsequent etching steps in the processing sequence for the fabrication of the interconnect.

In one embodiment, a portion of the second etch stop layer 206b and first ILD 202 of the interconnect 207 may be etched to make one or more gaps 212 in the first ILD 202. The one or more gaps 212 can have a predetermined depth and width. The dimensions (depth and/or width) of the gaps 212 can be dependent on the conditions of etching step. For example, the etching step may have a duration so that the second etching step may leave a portion of the gap 212 filled with ILD material (not shown). This may or may not be intentional depending on specific processing procedures and tolerances.

In one embodiment, the etching of the first ILD 202 can further include a dry etch. In another embodiment, the dry etch may have different chemical and/or mechanical components. In one embodiment, the etching of the first ILD 202 can be selective and/or orthogonal with respect to the spacer layer 210, the sacrificial member 208, and/or the one or more interconnect lines 204. That is, the etching of the first ILD 202 may not further etch the spacer layer 210, the sacrificial member 208, and/or the one or more interconnect lines 204.

In one embodiment, a second etch stop layer 206b may be disposed on the one or more interconnect lines 204 (including the exposed walls of the one or more interconnect lines 204) and the first ILD 202 after the etching of the portion of the second etch stop layer 206b and first ILD 202 of the interconnect 207. The second etch stop layer 206b can be used to hermetically seal the underlying layers (for example, the exposed interconnect lines 204 and/or the first ILD 202 defining gap 212). The second etch stop layer 206b may further prevent the interdiffusion of metal (for example, metal from the one or more interconnect lines 204) and/or any other materials in proximate layers or in preceding steps or following steps in the processing sequence of the interconnect 207. In various embodiments the second etch stop layer 206b can include a silicon nitride (SiN) material.

The interconnect 207 can further include a second ILD 214, which may be disposed onto the structure comprising the sacrificial member 208, the spacer layer 210, the second etch stop layer 206b, the first ILD 202 and the one or more interconnect lines 204. In one embodiment, the second ILD 214 may be a permanent and/or a non-conformal dielectric layer. The second ILD 214 may be deposited via any suitable mechanism, including but not limited to, chemical vapor deposition (CVD), physical evaporation chemical vapor deposition (PECVD) and/or by spin coating.

In one embodiment, the deposition of the second ILD 214 can cause the enclosure of one or more gaps 212, for example, air gaps. As mentioned, the presence of these gaps 212 can reduce the capacitance of the interconnect 207, and thereby promote and enhance the performance of the interconnect, for example, the timing and/or the power consumption of the interconnect. In various embodiments, the gaps 212 may include an air gap but may additionally (or alternatively) include any other gas (for example, nitrogen, helium, hydrogen, xenon, inert gasses, and so on), liquids, and/or dielectrics (for example low-K dielectrics). In one embodiment, such low-K dielectrics may be lower K with respect to proximate IDLs.

Figure 2E:
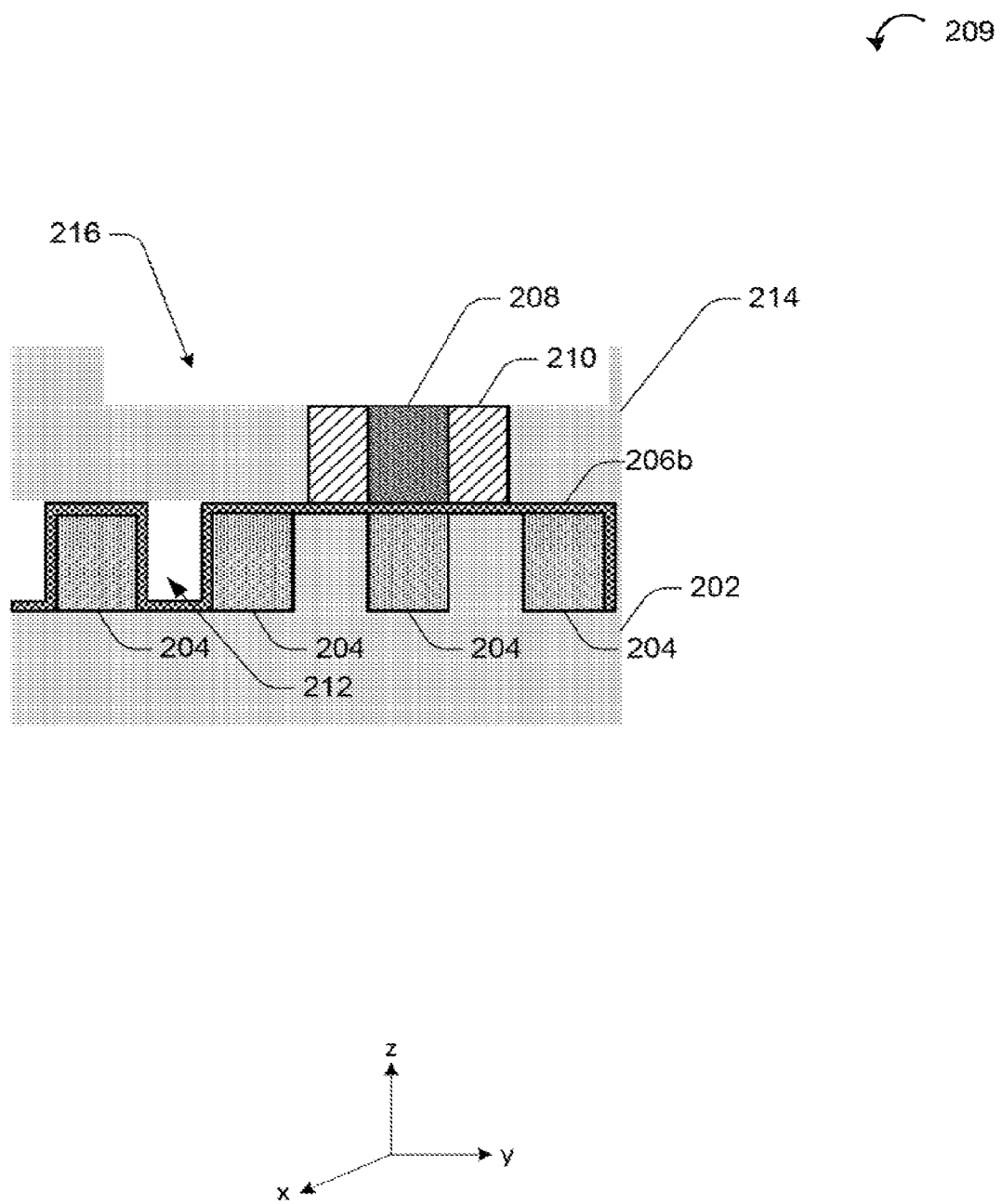

FIG. 2E illustrates another example cross-sectional view of an intermediate result of the processing sequence for the fabrication of a portion of the interconnect in occurrence with one or more embodiments of a disclosure.

The interconnect 209 can include a first ILD 202. The interconnect 209 can further include one or more interconnect lines (for example, one or more metal interconnect lines) 204, which may be formed in the first ILD 202. The one or more interconnect lines 204 may be similar, but not identical, to a portion of the first interconnect line 104 and/or the second interconnect line 106 of FIG. 1B.

The interconnect 209 can further include a second etch stop layer 206b, that may be disposed above the first ILD 202 and the one or more interconnect lines 204. The interconnect 207 can further include a sacrificial member 208 that is disposed above or onto the second etch stop layer 206b. The interconnect 207 can further include a spacer layer 210, which may be disposed also above the second etch stop layer 206b and the first ILD 202 and the one or more interconnect lines 204. In another embodiment, the spacer layer 210 can be used to mask the underlying layers (for example, a portion of the second etch stop layer 206b, a portion of the one or more interconnect lines 204, and a portion of the first ILD 202) during various etching steps in the processing sequence for the fabrication of the interconnect.

The interconnect 209 can further include a second ILD 214, which may be disposed onto the structure include the sacrificial member 208, the spacer layer 210, the second etch stop layer 206b, the first ILD 202 and the one or more interconnect lines 204. In one embodiment, the interconnect 209 can further include a patterned portion 216 of the second ILD 214. The patterning of the second ILD 214 to yield the patterned portion 216 can be performed by any suitable method including, but not limited to, etching, wet etch and/or a dry etch. In another embodiment, the dry etch may have different chemical and/or mechanical components. In one embodiment, the etching of the second ILD 214 can be selective with respect to the spacer layer 210, the sacrificial member 208, and/or the one or more interconnect lines 204. That is, the etching of the second ILD 214 may not further etch the spacer layer 210, the sacrificial member 208, and/or the one or more interconnect lines 204. In one embodiment, the patterning of the second ILD 214 to produce the pattern portion 216 of the second ILD 214 can provide area and/or volume for the subsequent deposition of a metal layer as shown and discussed in FIG. 2F below and related discussion.

Figure 2F:
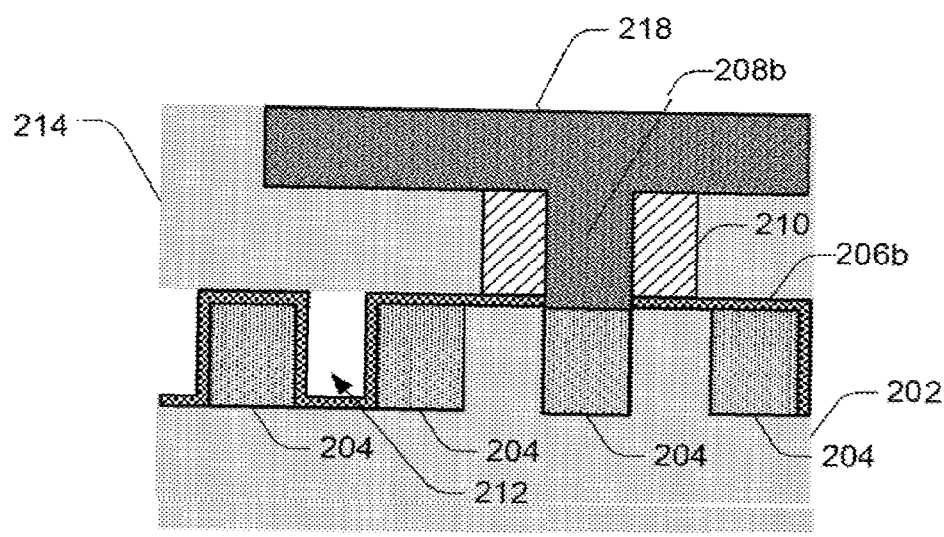
Figure 2F:
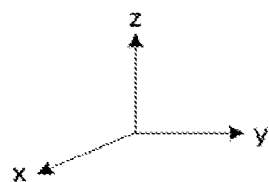

FIG. 2F illustrates an example cross-sectional view of an intermediate result of the processing sequence of the fabrication of a portion of the interconnect in accordance with one or more embodiments of the disclosure.

The interconnect 211 can include a first ILD 202. The interconnect 211 can further include one or more interconnect lines (for example, one or more metal interconnect lines) 204, which may be formed in the first ILD 202. The one or more interconnect lines 204 may be similar, but not identical, to a portion of the first interconnect line 104 and/or the second interconnect line 106 of FIG. 1B.

The interconnect 211 can further include a second etch stop layer 206b, that may be disposed above the first ILD 202 and the one or more interconnect lines 204. The interconnect 211 can further include a spacer layer 210, which may be disposed also above the second etch stop layer 206b and the first ILD 202 and the one or more interconnect lines 204. In another embodiment, the spacer layer 210 can be used to mask the underlying layers (for example, a portion of the second etch stop layer 206b, a portion of the one or more interconnect lines 204, and a portion of the first ILD 202) during various etching steps in the processing sequence for the fabrication of the interconnect. Further, the sacrificial member 208 of previous figures can be removed by one or more etching techniques (which, in some implementations, are discussed further in connection with FIGS. 3 and 4), for example, in order to allow for the metal layer 218 to make connection with an underlying one of the one or more interconnect lines 204 at one or more vias 208b.

The interconnect 211 can further include a second ILD 214, which may be disposed on the structure comprising the sacrificial member 208, the spacer layer 210, the second etch stop layer 206, the first ILD 202 and the one or more interconnect lines 204. The interconnect 211 can further include a metal layer 218, which may be formed in the patterned portion 216 (as shown in FIG. 2E) of the second ILD 214. The metal layer 218 can extend into the area of the previous sacrificial member 208, which can be removed as mentioned above. In one or more embodiments the metal layer 218 can be filled and polished into the patterned portion 216 of the second ILD 214 of FIG. 2E in accordance with standard processing methodologies.

One example advantage of the processing sequence to fabricate the interconnect shown in connection with FIGS. 2A-2F and related discussion include a reduction of mask count (e.g., a mark dictating where the one or more gaps, for example, air gap 212, will be located positioned) at least due to the gap (for example, air gap 212) being formed using the same mask as the via. In one embodiment, this can reduce the need for an additional mask. A further example advantage of the systems and methods disclosed herein includes the self-alignment of gap-generation mask to the via. The gap can be formed around via topography and may inherently be self-aligned to the via, which may allow the gaps to form in tight pitch features of the interconnect.

FIGS. 3A-3J show diagrams representing a processing sequence for the fabrication of an interconnect with gaps in accordance with one or more embodiments of the disclosure. It can be understood and appreciated that although a interconnect structure is formed by the processing sequence disclosed herein, the same processing sequence steps can be used in combination with one or more processing steps to produce a multilayer interconnect having any number of layers. For example, an interconnect having N layers where N is an integer. In various embodiments FIGS. 3A-3J represent a first embodiment as similar to the embodiment disclosed in connection with FIGS. 2A-2F but showing more details in one or more processing steps.

Figure 3A:
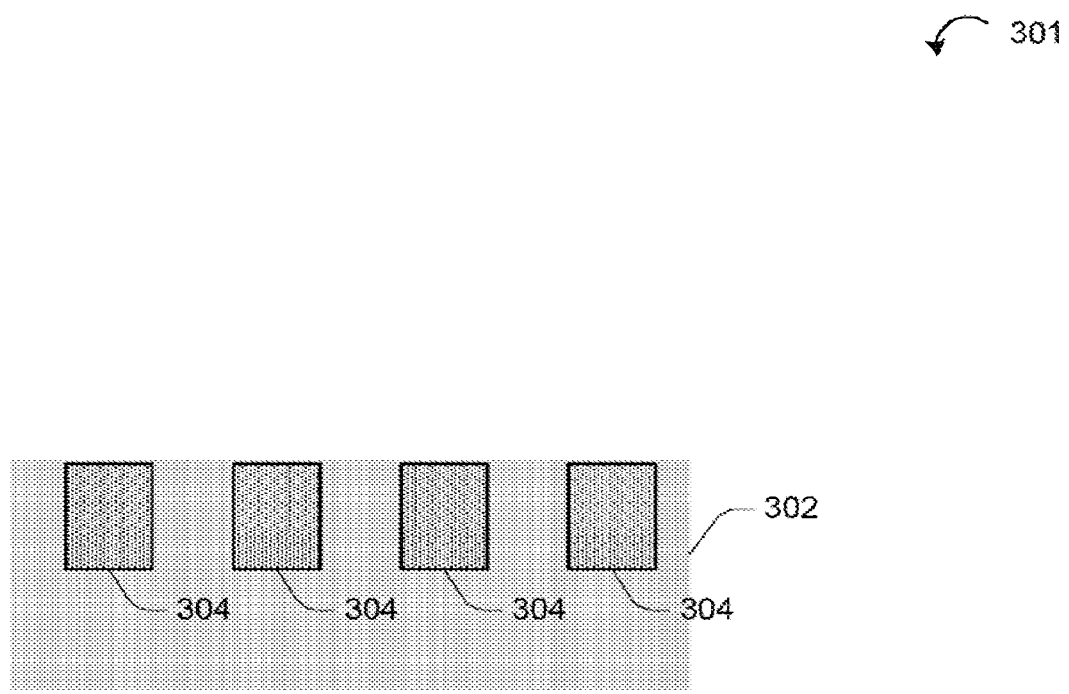
FIGS. 3A-3J illustrate another example process flow for the fabrication of an interconnect in accordance with example embodiments of the disclosure.
Figure 3A:
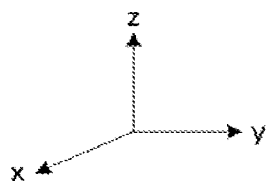

FIG. 3A illustrates an example cross-sectional view of an intermediate result of the processing sequence for the fabrication of a portion of the interconnect in accordance with one or more embodiments of the disclosure. In one embodiment, the two layer interconnect 301 can include a first ILD 302. In another embodiment, the first ILD may be a permanent and/or non-conformal layer. The first ILD 302 may be deposited via any suitable method including, but not limited to, CVD, PECVD and/or spin coating. The first ILD 302 can have any suitable thickness, for example, the first ILD 302 can have a thickness of approximately 5 nanometers to approximately 1000 nanometers with a preferential thickness of 30 nanometers to approximately 60 nanometers.

In one embodiment, the interconnect 301 can further include one or more interconnect lines (for example, one or more metal interconnect lines) 304 that may be formed in the first ILD 302. In various embodiments, the formation of the interconnect lines 304 may include a trench formation (not shown) followed by the filling of the trenches with metals to produce one or more interconnect lines. In one embodiment, the one or more interconnect lines 304 may be similar, but not identical, to the portion of the first interconnect lines 104 and/or the second interconnect lines 106 of FIG. 1B.

Figure 3B:
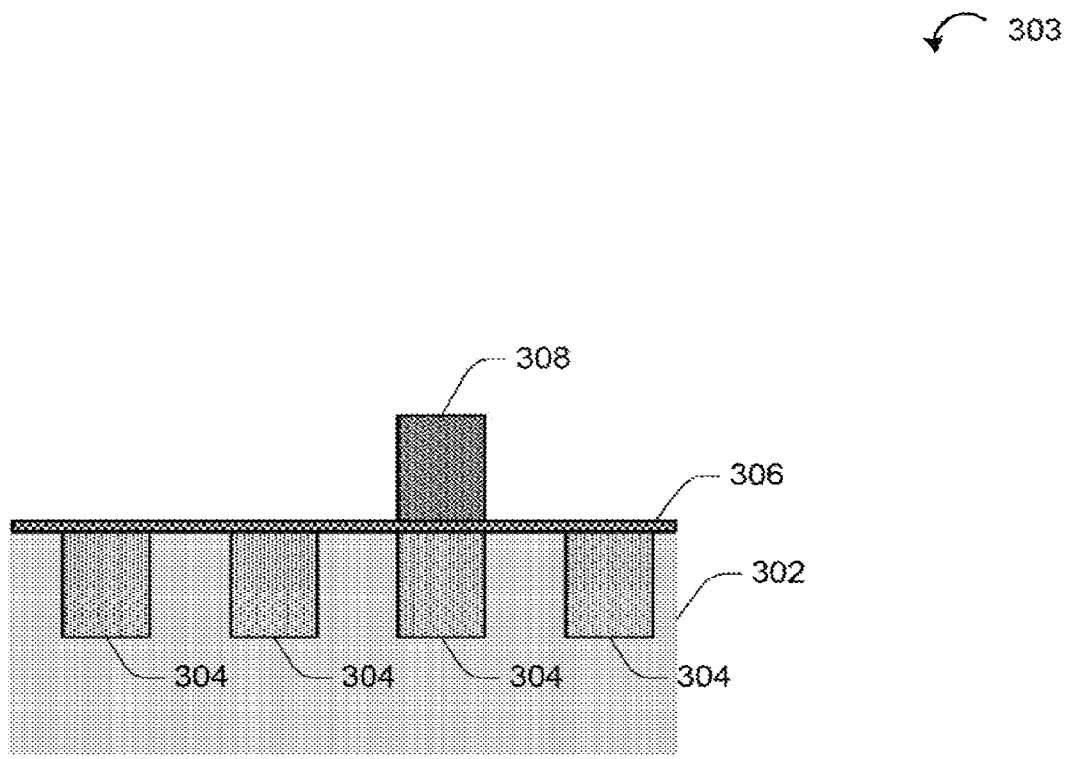

FIG. 3B illustrates an example cross-sectional view of an intermediate result of the processing sequence for the fabrication of a portion of the interconnect in accordance with one or more embodiments of the disclosure. In one embodiment, the interconnect 303 can include a first ILD 302. The interconnect 303 can further include one or more interconnect lines (for example, one or more metal interconnect lines) 304. In various embodiments, the one or more interconnect lines 304 can be formed in the first ILD 302.

The interconnect 303 can further include a second etch stop layer 306b, that may be disposed above the first ILD and the one or more interconnect lines 304. The etch stop layer can be used to hermetically seal the underlying layers (for example, the plurality of interconnect lines 304 and/or the first ILD 302). The second etch stop layer 306b may further prevent the interdiffusion of metal (for example, metal from the one or more interconnect lines 304) and/or any other materials in proximate layers or in preceding steps or following steps in the processing sequence of the interconnect 303. In various embodiments the second etch stop layer 306b can include a silicon nitride (SiN) material.

In one embodiment, the interconnect 303 can further include a sacrificial member 308, that is disposed above the second etch stop layer 306b. The sacrificial member 308 may act as a temporary placeholder for a via that will be formed in further processing steps (to be discussed below). In one embodiment the sacrificial member 308 can include a titanium nitride (TiN) material. The sacrificial member 308 can further include any sacrificial conductive and/or nonconductive material including, but not limited to, amorphous silicon, any metal oxide, and/or titanium nitride (TiN), and/or titanium (Ti). In one embodiment, the sacrificial member can be formed by any suitable method including, but not limited to, chemical vapor deposition (CVD) and/or plasma-enhanced chemical vapor deposition (PECVD). In one embodiment, the sacrificial member 308 can be patterned using a mask during the deposition of the sacrificial member 308. In another embodiment, the sacrificial via 308 can be etch-selective to the first ILD 302 etching. In one embodiment, the sacrificial member 308 can prevent punch-through to the metal layers in one or more interconnect lines 304 below, for example, during an etching step to be described below.

Figure 3C:
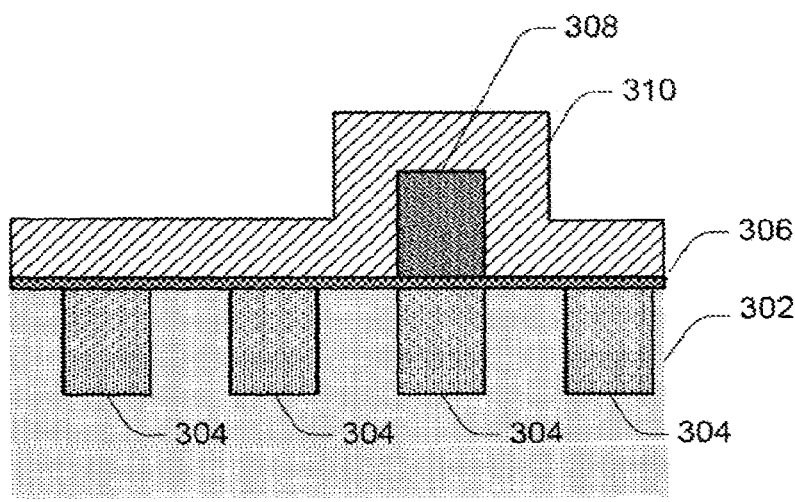

FIG. 3C illustrates an example cross-sectional view of an intermediate result of the processing sequence for the fabrication of a portion of the interconnect in accordance with one or more embodiments of the disclosure. In one embodiment, the interconnect 305 can include a first ILD 302. In another embodiment, the interconnect 305 can further include one or more interconnect lines 304 that may be formed in the first ILD 302.

The interconnect 305 may further include an second etch stop layer 306b, which may be disposed above the first ILD 302 and the one or more interconnect lines 304. The interconnect 305 may further include a sacrificial member 308, which may be disposed above the second etch stop layer 306b using one or more masks.

The interconnect 305 may further include a spacer layer 310, which may be disposed onto the sacrificial member 308 and the second etch stop layer 306b and may be disposed above the first ILD 302 and the one or more interconnect lines 304. In one embodiment, the spacer layer of the spacer layer 310 can include a metal oxide such as, for example, silicon dioxide, $SiO_2$. In one embodiment, the spacer layer 310 can be deposited using any suitable method including, but not limited to, CVD, PECVD and/or ALD. In another embodiment, the spacer layer 310 can be a nonconductive material. In one embodiment, the spacer layer 310 can be a permanent (for example, non-sacrificial) material. In another embodiment, the spacer layer 310 can be etch selective to the first ILD 302. In another embodiment, the thickness of the spacer layer 310 can be greater than or equal to approximately one-half the thickness of the spacing between adjacent interconnect lines 304. In one or more embodiments, the spacer layer 310 can act as a hard mask blocking regions with tight-pitch features and underlined layers allowing other regions to be etched downstream. In another embodiment, the spacer layer 310 may be conformal to facilitate deposition around the tight-pitch topography of the underlying layers. In one or more embodiments, the spacer layer 310 can be patterned in subsequent steps such as that shown in connection with FIG. 4D and relevant discussion. In one embodiment, the spacer layer can be etched using hydrofluoric acid (HF).

Figure 3D:
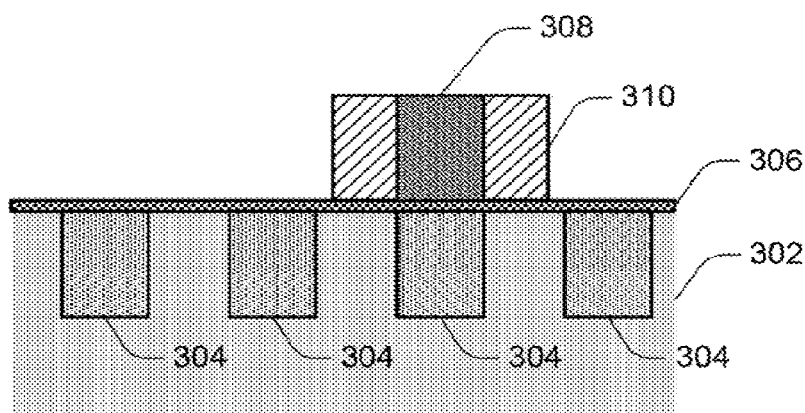

FIG. 3D illustrates an example cross-sectional view of an intermediate result of the processing sequence for the fabrication of a portion of the interconnect in accordance with one or more embodiments of the disclosure. In one embodiment, the interconnect 307 can include a first ILD 302. In another embodiment, the interconnect 305 can further include one or more interconnect lines (for example, one or more metal interconnect lines) 304 that may be formed in the first ILD 302.

In one embodiment, the interconnect 307 may further include an etch stop layer 306, which may be disposed above the first ILD 302 and the one or more interconnect lines 304. The interconnect 305 may further include a sacrificial member 308, which may be disposed above the etch stop layer 306 using one or more masks.

The interconnect 307 may further include a spacer layer 310, which may be disposed onto the sacrificial member 308 and the etch stop layer 306 and may be disposed above the first ILD 302 and the one or more interconnect lines 304.

The interconnect 307 may further include a spacer layer 310 that may be etched in accordance with any suitable techniques disclosed herein. In one embodiment, the spacer layer 310 can be etched via dry etched and/or a wet etch. In another embodiment, the spacer layer 310 can be etched directionally, for example, only etched in the download direction with respect to the Z-axis.

As mentioned, the sacrificial member 308 and/or the spacer layer 310 can act as a mask blocking directly underlying regions with high pitch features thereby allowing unmasked regions to be etched in various processing sequence steps for the fabrication of a portion of the interconnect. In one embodiment, the etching of the spacer layer 310 can be performed using a dry etch.

Figure 3E:
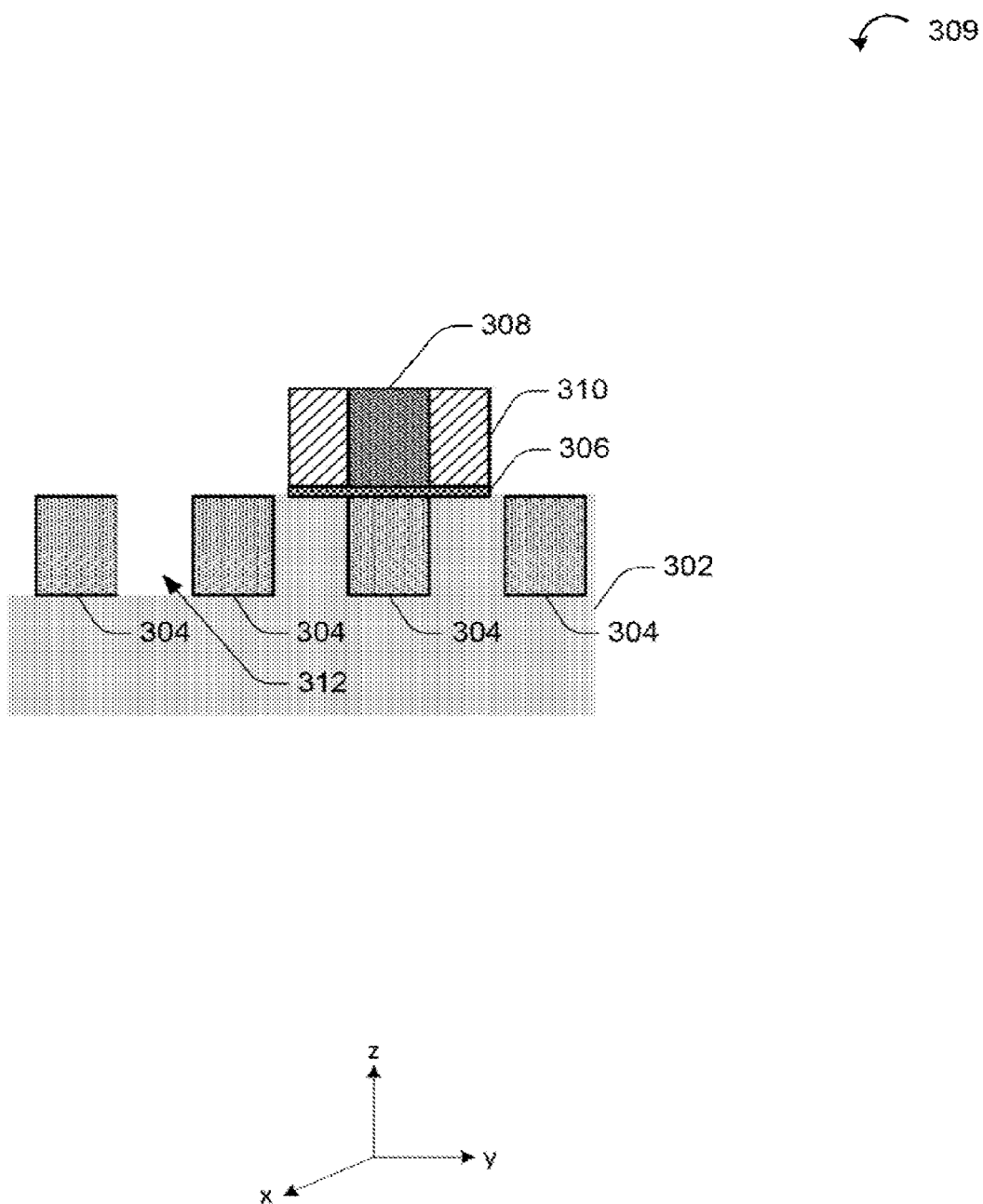

FIG. 3E illustrates an example cross-sectional view of an intermediate result of the processing sequence for the fabrication of a portion of the interconnect in accordance with one or more embodiments of the disclosure.

In one embodiment, the interconnect 309 may include a first ILD 302. The interconnect 309 may further include one or more interconnect lines (for example, one or more metal interconnect lines) 304, which may be formed in the first ILD 302.

In one embodiment, the interconnect 309 may further include and etch stop layer 306 that may be disposed on the first ILD 302 and the one or more interconnect lines 304. The interconnect 309 may further include a sacrificial member 308, which may be disposed on the etch stop layer 306, the first ILD 302 and the one or more interconnect lines 304.

In one embodiment, the interconnect 309 may further include a spacer layer 310. The spacer layer 310 may be disposed on the etch stop layer 306, the first ILD 302 and the one or more interconnect lines 304.

The interconnect 309 may further include a spacer layer 310 and the etch stop layer 306, which may have been etched by any suitable method, as shown and described in connection with FIG. 3D.

Figure 3F:
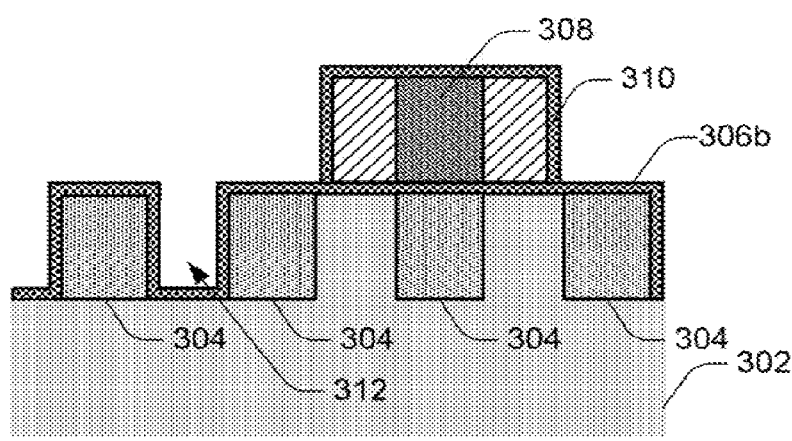

In various embodiments, the interconnect 309 can have a portion of the first ILD 302 and the etch stop layer 306 removed, for example, by an etching process. In one embodiment, the etching of the etch stop layer 306 and/or the first ILD 302 may be selective to the etching of the spacer layer 310 as described in connection with FIG. 3D. In another embodiment, the etching of the etch stop layer 306 and the first ILD 302 may be done by any suitable method including a wet etch and/or dry etch. The etching of the ILD 302 and the etch stop layer 306 may cause a formation of a gap 312, for example, an air gap 312, in the first ILD 302. In one or more embodiments, the gap 312 can be defined by an area proximate to one or more interconnect lines 304, and a portion of the first ILD 302; furthermore, the gap 312 may be proximal to an etch stop layer 306b as shown in FIG. 3F and related discussion, which can be adjacent to the one or more interconnect lines 304 and the portion of the first ILD 302. In various embodiments, the dimensions (depth and/or width) of the gaps 312 can be dependent on the etching step and/or the dimensions of the spacer layer 310 and other processing factors. For example, the etching step may have had a duration so that the etching step may leave a portion of the gaps 312 filled with ILD material (not shown). This may or may not be intentional depending on specific processing procedures and tolerances. In one embodiment, the gap 312 may include air or any other suitable gas, liquid, or dielectric material. In an embodiment, the gap 312 may include a lower K dielectric with respect to neighboring ILD layers (for example, the first ILD 302).

FIG. 3F illustrates an example cross-sectional view of an intermediate result of the processing sequence for the fabrication of a portion of the interconnect in accordance with one or more embodiments of the disclosure.

In one embodiment, the interconnect 311 can include a first ILD 302. The interconnect 311 can further include one or more interconnect lines (for example, one or more metal interconnect lines) 304 that may be formed in the first ILD 302.

The interconnect 311 can further include a sacrificial member 308, which may be disposed on the structure comprising a second etch stop layer 306b and the first ILD 302 and the one or more interconnect lines 304. The interconnect 311 can further include a spacer layer 310, which may be disposed on the structure comprising the second etch stop layer 306b, the first ILD 302 and the one or more interconnect lines 304. The interconnect 311 may further include a gap 312, for example, and air gap 312.

In one embodiment, a second etch stop layer 306b may be disposed on the one or more interconnect lines 304 and the first ILD 302 after the etching of the portion of the second etch stop layer 306b and first ILD 302 of the interconnect 309 as shown and discussed in connection with FIG. 3E. The second etch stop layer 306b can be used to hermetically seal the underlying layers (for example, the plurality of interconnect lines 304 and/or the first ILD 302, and/or the gap 312). The second etch stop layer 306b may further prevent the interdiffusion of metal (for example, metal from the one or more interconnect lines 304) and/or any other materials in proximate layers or in preceding steps or following steps in the processing sequence of the interconnect 311. In various embodiments the second etch stop layer 306b can include a silicon nitride (SiN) material. In one embodiment, the second etch stop layer 306b may be deposited using any suitable method including, but not limited to, CVD, PECVD and/or ALD.

Figure 3G:
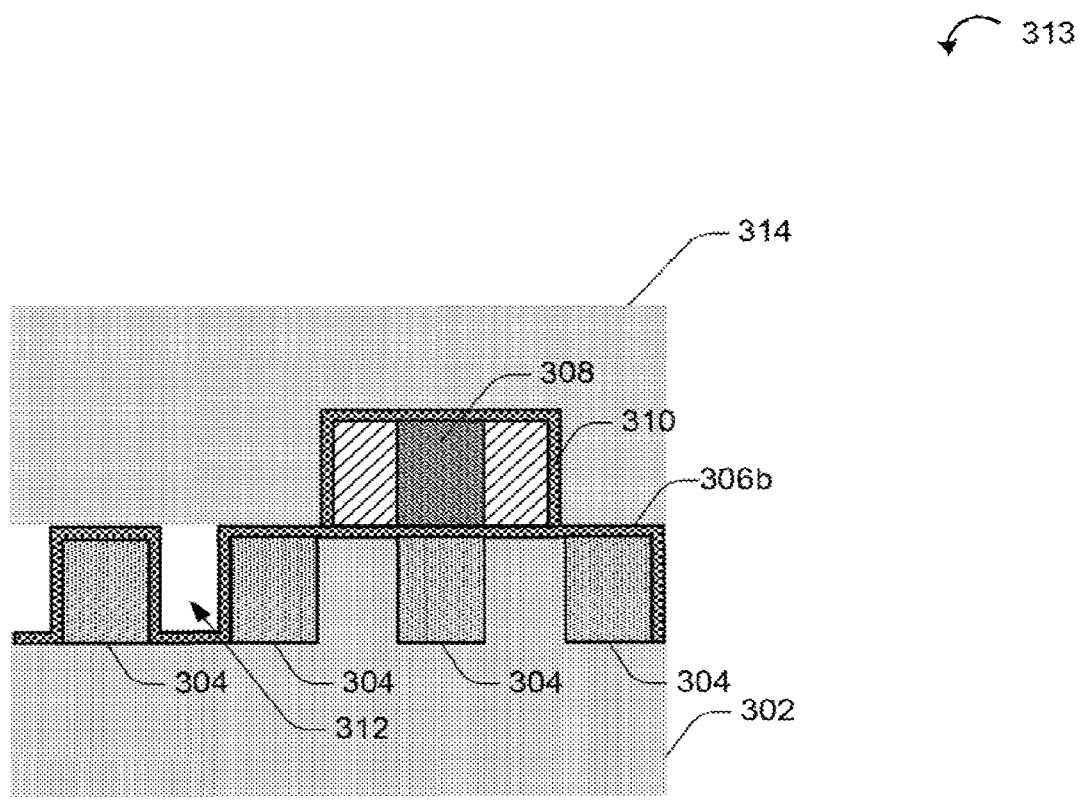

FIG. 3G illustrates an example cross-sectional view of processing sequence for the fabrication of a portion of the interconnect in accordance with one or more embodiments of the disclosure.

In one embodiment, the interconnect 311 can include a first ILD 302. The interconnect 311 can further include one or more interconnect lines (for example, one or more metal interconnect lines) 304 that may be formed in the first ILD 302.

The interconnect 311 can further include a sacrificial member 308, which may be disposed on the structure comprising the second etch stop layer 306b and the first ILD 302 and the one or more interconnect lines 304. The interconnect 311 can further include a spacer layer 310, which may be disposed on the structure comprising the second etch stop layer 306b, the first ILD 302 and the one or more interconnect lines 304. The interconnect 311 may further include a gap 312, for example, and air gap 312. The interconnect 313 can further include an second etch stop layer 306b, which may be used to hermetically seal the underlining layers, for example, the first ILD 302 and/or the one or more interconnect lines 304.

The interconnect 313 can further include a second ILD 314, which may be disposed on or proximate to the structure including the sacrificial member 308, the spacer layer 310, the second etch stop layer 306b, the first ILD 302 and the one or more interconnect lines 304. The second ILD 314 can be a permanent and/or a nonconductive layer. In one embodiment, the deposition of the second ILD 314 may lead to the enclosure of the gap (for example, air gaps) 312, for example, since the second ILD can be a non-conformal layer. The second ILD 314 can be deposited by any suitable method including, but not limited to, CVD, PECVD and/or spin coating. In one embodiment, the second ILD 314 can have a thickness of approximately 5 nanometers to approximately 1,000 nanometers with a preferred thickness of 30 nanometers to approximately 60 nanometers. In one embodiment the second ILD 314 may be mechanically polished after deposition.

Figure 3H:
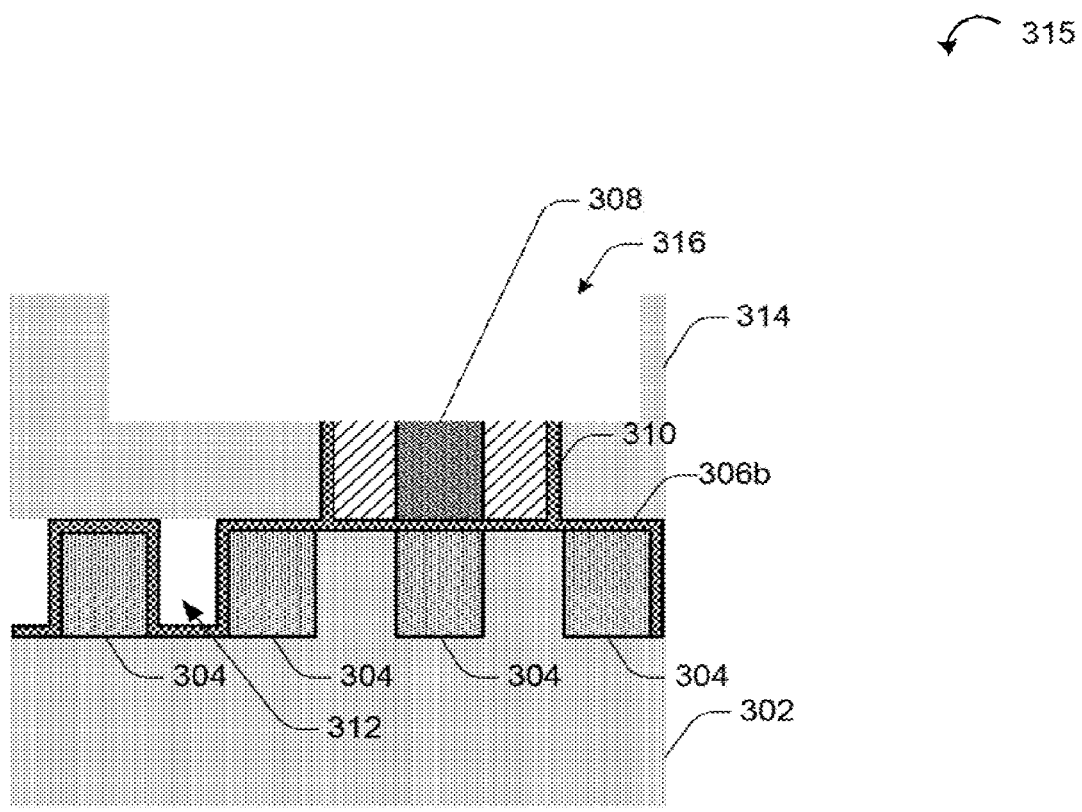
Figure 3H:
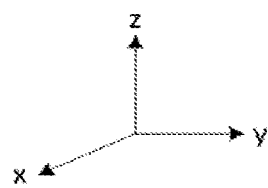

FIG. 3H illustrates and example cross-sectional view of an intermediate result of the processing sequence for the fabrication of a portion of the interconnect in accordance with one or more embodiments of the disclosure.

In one embodiment, the interconnect 315 can include a first ILD 302. The interconnect 315 can further include one or more interconnect lines (for example, one or more metal interconnect lines) 304 that may be formed in the first ILD 302. In another embodiment, the interconnect 315 can further include an second etch stop layer 306b, which may be disposed on the first ILD 302 and the one or more interconnect lines 304.

The interconnect 315 may include a sacrificial member 308 which may be disposed on the etch stop layer, the first ILD 302 and the one or more interconnect lines 304. The interconnect 315 can further include a spacer layer which may be disposed on the second etch stop layer 306b, the first ILD 302 and one or more interconnect lines 304.

The interconnect 315 can further include a second ILD 314, which may be disposed on the sacrificial member 308, the spacer layer 310, the second etch stop layer 306b, the first ILD 302 and the one or more interconnect lines 304. In one embodiment, as described in the proceeding figures, the deposition of the second ILD 314 may enclose the one or more gaps (for example, air gaps) 312.

In one embodiment, the interconnect 315 may further include a patterned part 316 of the second ILD 314. The patterning of the second ILD 314 to yield the patterned portion 316 can be performed by any suitable method including, but not limited to, etching, wet etch and/or a dry etch. In one embodiment, the etching can further remove a portion of the second etch stop layer 306b. In another embodiment, the dry etch may have different chemical and/or mechanical components. In one embodiment, the etching of the first ILD 302 can be selective and/or orthogonal with respect to the spacer layer 310, the sacrificial member 308, and/or the one or more interconnect lines 304. That is, the etching of the second ILD 314 may not further etch the spacer layer 310, the sacrificial member 308, and/or the one or more interconnect lines 304.

In various embodiments, the patterning of the part 316 of the second ILD 314 may be done such that subsequent processing steps can fill the pattern part 316 of the second ILD 314 with a suitable material, for example, a metal layer, in order to complete the via structure as will be shown and described in connection with FIGS. 3I and 3J below.

Figure 3I:
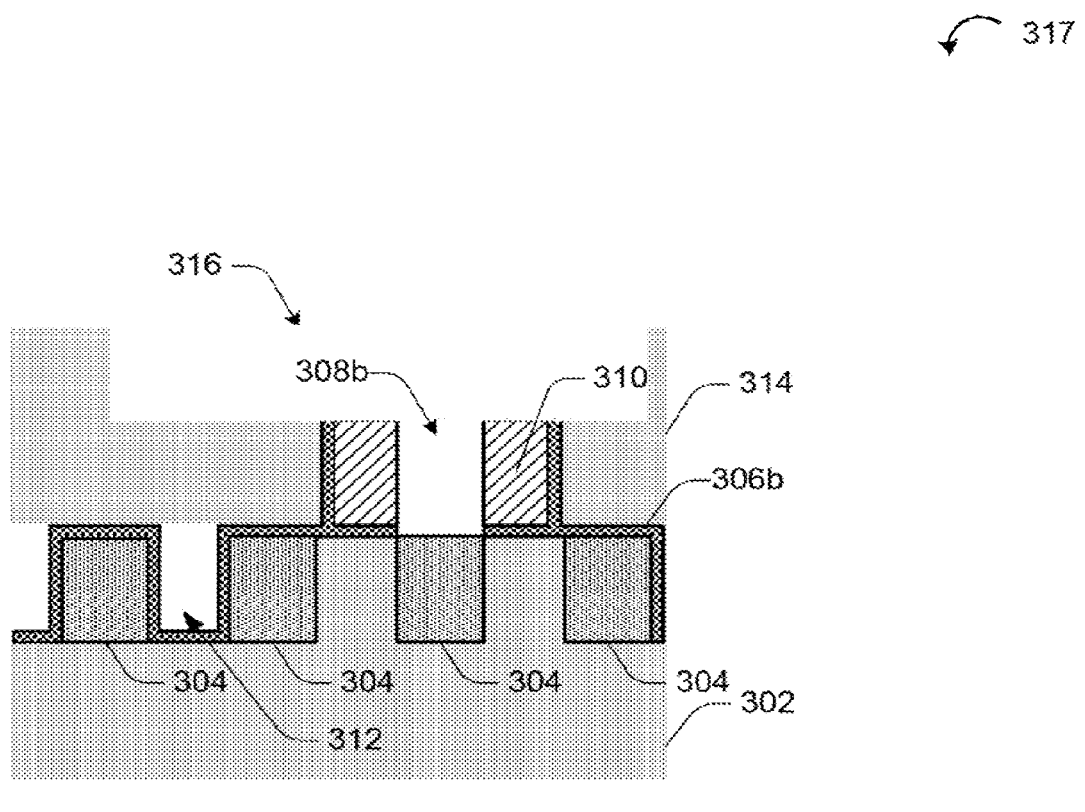

FIG. 3I illustrates and example cross-sectional view of an intermediate result of the processing sequence with the fabrication of a portion of the interconnect in accordance with one or more embodiments of the disclosure.

The interconnect 317 can include a first ILD 302. The interconnect 317 can further include one or more interconnect lines (for example, one or more metal interconnect lines) 304 that may be formed in the first ILD 302. The interconnect 317 may further include a second etch stop layer 306b, which may be disposed on the first ILD 302 and the one or more interconnect lines 304.

The interconnect 317 may further include a spacer layer 310, which may be disposed on the etch-stop material 306b, the first ILD 302, and the one or more interconnect lines 304. The interconnect 317 may further include a second ILD 314, which may be disposed on the spacer layer 310, the second etch stop layer 306b, the first ILD 302 and the one or more interconnect lines 304. The interconnect 317 may further include a patterned portion 316 of the second ILD 314 as described in the preceding FIG. 3H.

In one embodiment, the sacrificial member 308 (shown and discussed in connection with FIGS. 3B-3H, for example) and a portion of the second etch stop layer 306b may be removed in the interconnect 317 using any suitable technique to yield a via 308b. This can be done in order to allow for the subsequent filling of the area defined by the sacrificial member 308 of previous FIGS. 3B-3H with a metal layer as shown in the following FIG. 3J. The removal of the sacrificial member 308 and a portion of the second etch stop layer 306b to yield the via 308b can be done using any suitable method including, but not limited to, a wet etch and/or a dry etch. In another embodiment, the dry etch may have different chemical and/or mechanical components. In one embodiment, the etching of the sacrificial member 308 of previous FIGS. 3B-3H can be selective with respect to the spacer layer 310, and/or the one or more interconnect lines 304. That is, the etching of the of the sacrificial member 308 of previous FIGS. 3B-3H may not further etch the spacer layer 310 and/or the one or more interconnect lines 304.

Figure 3J:
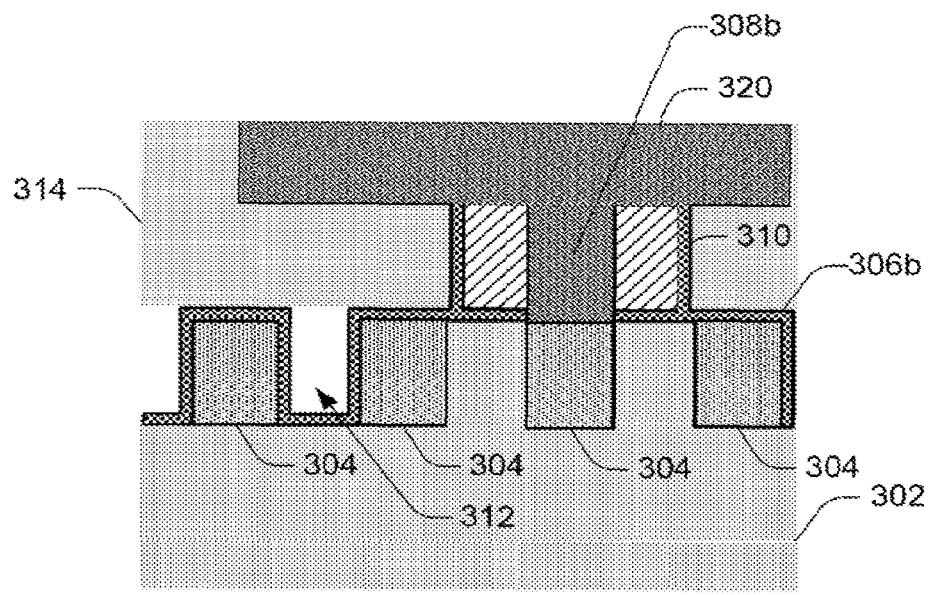
Figure 3J:
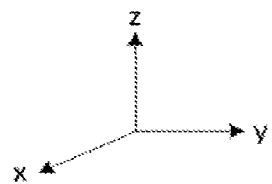

FIG. 3J illustrates an example cross-sectional view of an intermediate result of a processing sequence for the fabrication of a portion of the interconnect in accordance with one or more embodiments of the disclosure.

The interconnect 319 may include a first ILD 302. The interconnect 319 may further include one or more interconnect lines 304, which may be formed in the first ILD 302. The interconnect 319 may further include an second etch stop layer 306b, which may be disposed on the first ILD 302 and the one or more interconnect lines 304.

The interconnect 319 may further include a spacer layer 310, which may be disposed on the etch stop layer 306b, the first ILD 302 and the one or more interconnect lines 304. The interconnect 319 may further include a second ILD 314, which may be disposed on the etch stop layer 306b, the spacer layer 310, the first ILD 302 and the one or more interconnect lines 304.

The interconnect 319 may further include a gap (for example, an air gap) 312, which may be formed by the deposition of the second ILD 314 on the underlying layers (for example, the etch stop layer 306b, the first ILD 302 and the one or more interconnect lines 304).

Further, the interconnect 319 may further include a second metal layer 320, which can be disposed on the second ILD 314 and the spacer layer 310. In one embodiment, at least a portion of the second metal layer 320 may be mechanically and/or electrically connected with the one or more interconnect lines 304. In one embodiment the second metal layer 320 can form one or more vias 308b, which were previously the site of the sacrificial member 308 in preceding FIGS. (see, for example, FIGS. 3A-3J and relevant description).

In one embodiment, the second metal layer 320 may be disposed via any suitable method, including CVD and/or PECVD. The deposition of the second metal layer 320 may further include an additional step of a deposition of an adhesion layer. The adhesion layer may be any suitable material, including, for example, titanium, tantalum, tungsten, molybdenum, titanium nitride, tantalum nitride, cobalt, cobalt-tungsten-boron, alloys of the aforementioned, combinations thereof, or the like. The deposition of the second metal layer 320 may further include an additional step of a deposition of a metal (for example, a copper layer), which may act as an adhesion promoter, enhance wetting between layers, and/or act as a metal seed layer. The metal seed layer may be deposited by any suitable technique, including but not limited to electroplating. The metal seed layer may be deposited over the adhesion layer, in embodiments. The metal seed layer may be deposited by any suitable mechanism, such as a sputtering process. The metal seed in some embodiments, may be deposited by PVD, CVD, evaporation, ALD, combinations thereof, or the like. The metal seed layer may be copper, cobalt, aluminum, combinations thereof, or the like.

Figure 4A:
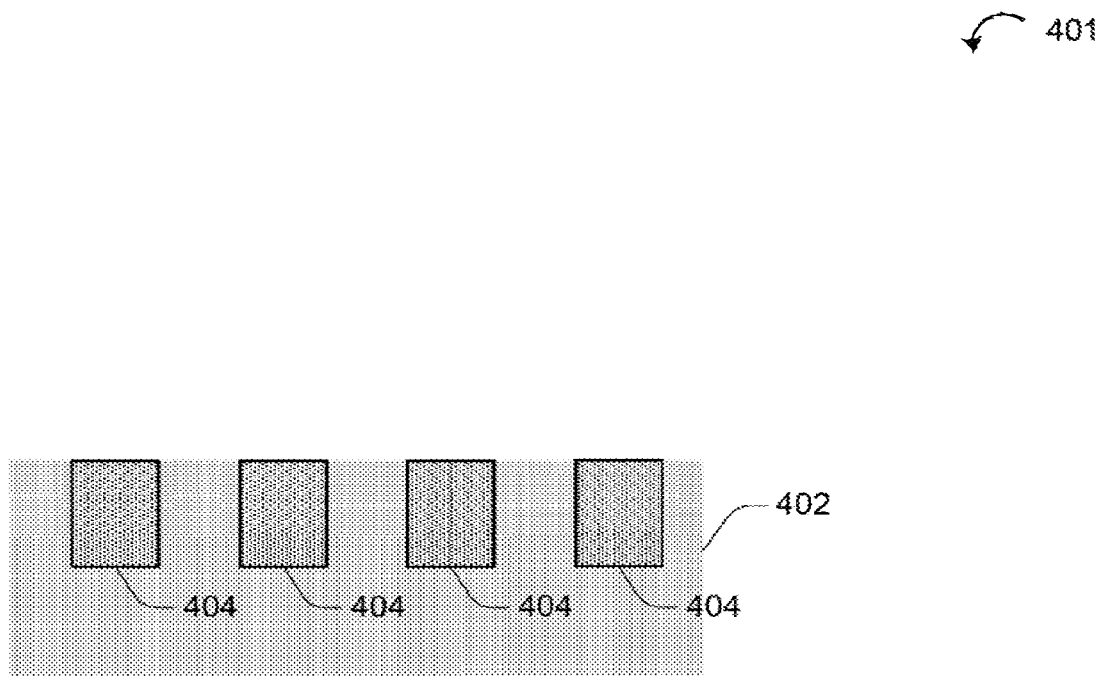
FIG. 4A-4M illustrate another example process flow for the fabrication of an interconnect in accordance with example embodiments of the disclosure.
Figure 4A:
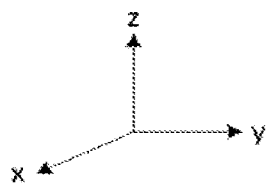

FIGS. 4A-4M illustrates an example cross-sectional view of an intermediate result of the processing sequence for the fabrication of a interconnect in accordance with one or more embodiments of the disclosure. In particular, FIG. 4A illustrates an example cross-sectional view of an intermediate result of the processing sequence for a portion of the fabrication of the interconnect in accordance with one or more embodiments of the disclosure.

In one embodiment, the interconnect 401 can include a first ILD 402. In another embodiment, the first ILD 402 may be a permanent and/or non-conformal layer. The first ILD 402 may be deposited via any suitable method including, but not limited to, CVD, PECVD and/or spin coating. The first ILD 402 can have any suitable thickness, for example, the first ILD 402 can have a thickness of approximately 5 nanometers to approximately 1000 nanometers with a preferred thickness of 30 nanometers to approximately 60 nanometers.

In one embodiment, the interconnect 401 can further include one or more interconnect lines (for example, one or more metal interconnect lines) 404 that may be formed in the first ILD 402. In various embodiments, the formation of the interconnect lines 404 may include a trench formation (not shown) followed by the filling of the trenches with metals to produce one or more interconnect lines. In one embodiment, the one or more interconnect lines 404 may be similar, but not identical, to the portion of the first interconnect lines 104 and/or the second interconnect lines 106 of FIG. 1B.

Figure 4B:
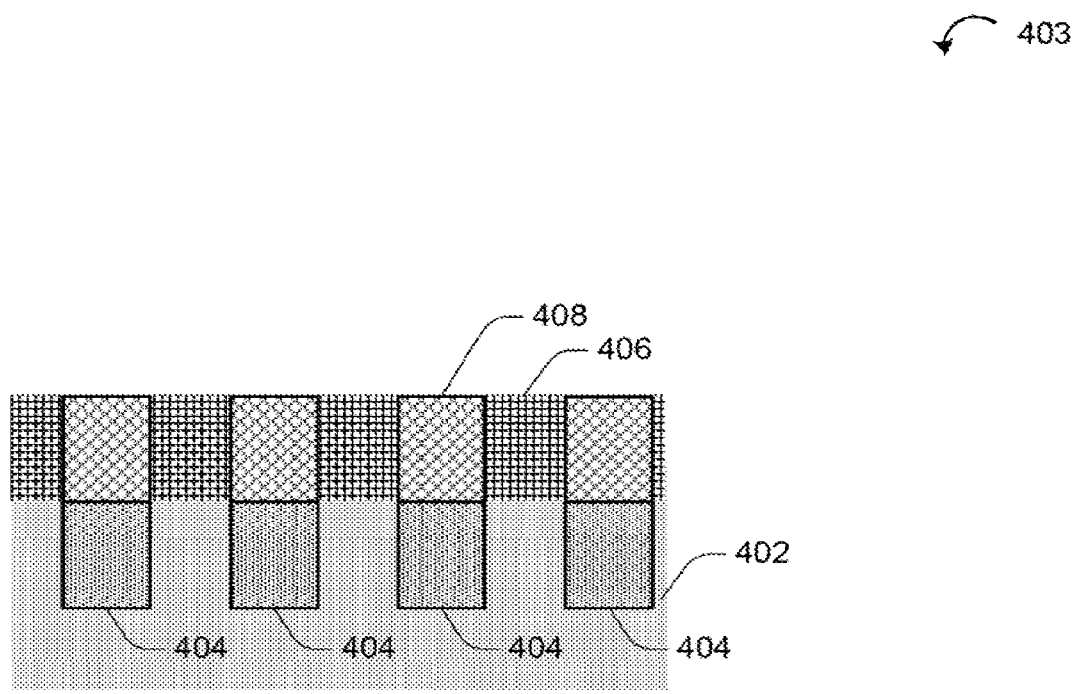

FIG. 4B illustrates an example cross-sectional view of an intermediate result of the processing sequence for a portion of the fabrication of the interconnect in accordance with one or more embodiments of the disclosure. In one embodiment, the interconnect 403 can include a first ILD 402. In another embodiment the interconnect 403 can include one or more interconnect lines (for example, one or more metal interconnect lines) 404, which may be formed in the first ILD 402.

In another embodiment, a first direct self-assembly (DSA) material 406 and a second DSA material 408 may be disposed on the one or more interconnect lines 404 and the first ILD 402. In one embodiment the first DSA material 406 and the second DSA material 408 may be formed by any suitable DSA method. In one embodiment, the DSA method can include two sacrificial polymers, for example, polystyrene and poly(methyl methacrylate) (PMMA) that do not mix with one another. In another embodiment the two polymers may be deposited sequentially, for example, a first thin layer of the first polymer may be deposited first followed by a thicker deposition of the second polymer onto the one or more interconnect lines 404 and the first ILD 402. The two polymer materials may act as a template for the deposition of more permanent materials. In one embodiment, the two permanent materials can include, for example, silicon dioxide $SiO_2$ and silicon nitride (SiN), that may replace the first DSA material 406 and the second DSA material 408. In another embodiment, the permanent materials that are formed as the first DSA materials 406 and the second DSA materials 408 can be etch selective between one another. Further, the first DSA material 406 and the second DSA material 408 can be self-aligned to the one or more interconnect lines 404 that are underneath.

Figure 4C:
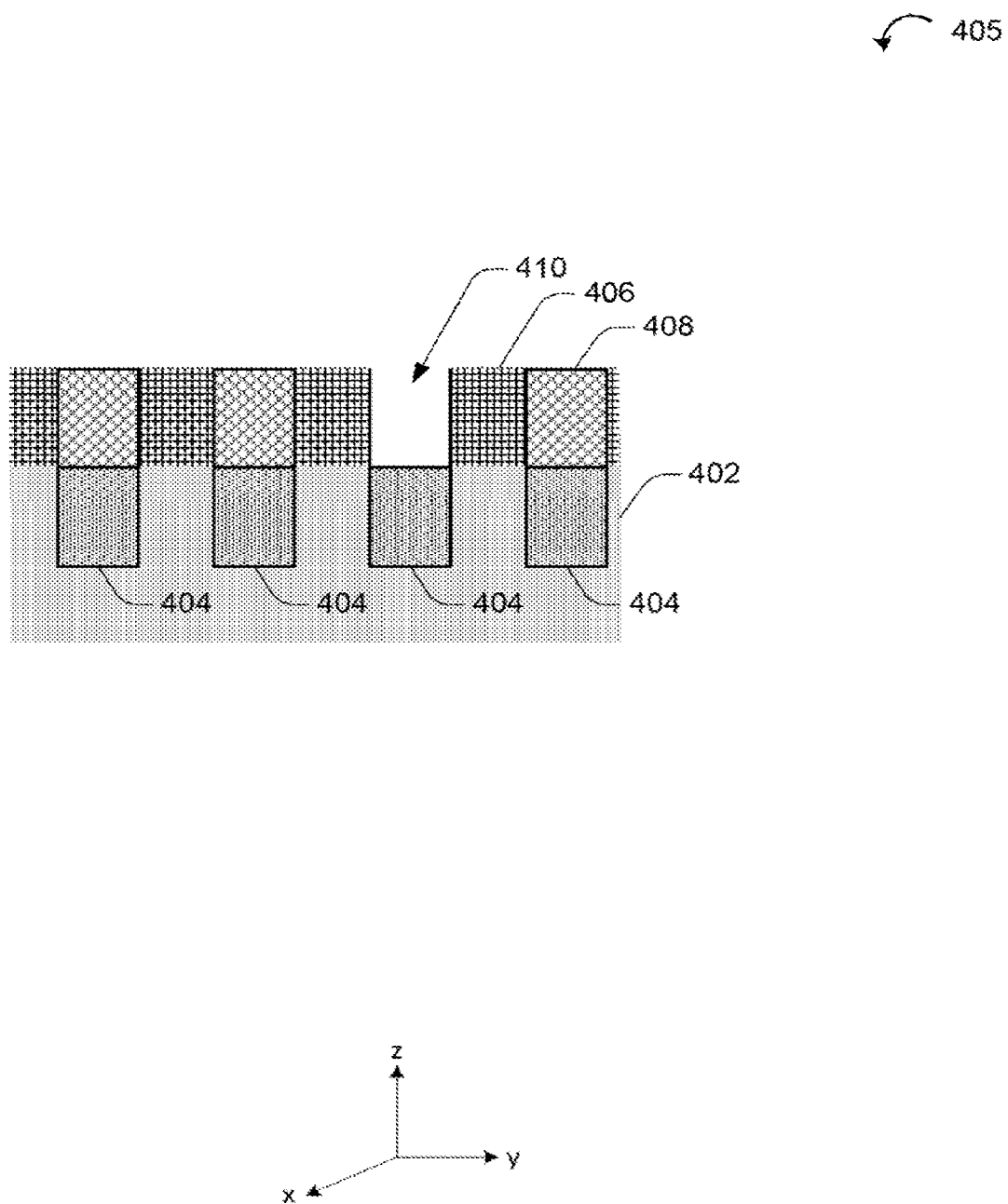

FIG. 4C illustrates another example cross-sectional view of processing sequence for the fabrication of a portion of the interconnect in accordance with one or more embodiments of the disclosure. In one embodiment, the interconnect 405 can include a first ILD 402. In another embodiment, the interconnect 405 can further include one or more interconnect lines 404 (for example, one or more metal interconnect lines) that may be formed in the first ILD 402. The interconnect 405 can further include a first DSA material 406 and a second DSA material 408 that may be formed on the first ILD 402 and the one or more interconnect lines 404. The first DSA material 406 and the second DSA material 408 may be fabricated using a DSA method as further described in connection with FIG. 4B and related description.

The interconnect 405 can further include a via trench 410. In various embodiments, the via trench 410 may be formed by etching the second DSA material 408 disposed above one of the interconnect lines 404. The process of opening the via trench 410 can include any suitable method including, but not limited to, a wet etch and/or a dry etch. In another embodiment, the dry etch may have different chemical and/or mechanical components. In one embodiment, the etching of the second DSA material 408 can be selective and/or orthogonal with respect to the first DSA material 406, the first ILD 402, and/or the one or more interconnect lines 404. That is, the etching of the second DSA material 408 may not further etch the first DSA material 406, the first ILD 402, and/or the one or more interconnect lines 404. In one embodiment, the patterning of the second DSA material to produce the via trench 410 can provide area and/or volume for the subsequent deposition of a sacrificial member as shown and discussed in FIG. 4D below and related discussion.

Figure 4D:
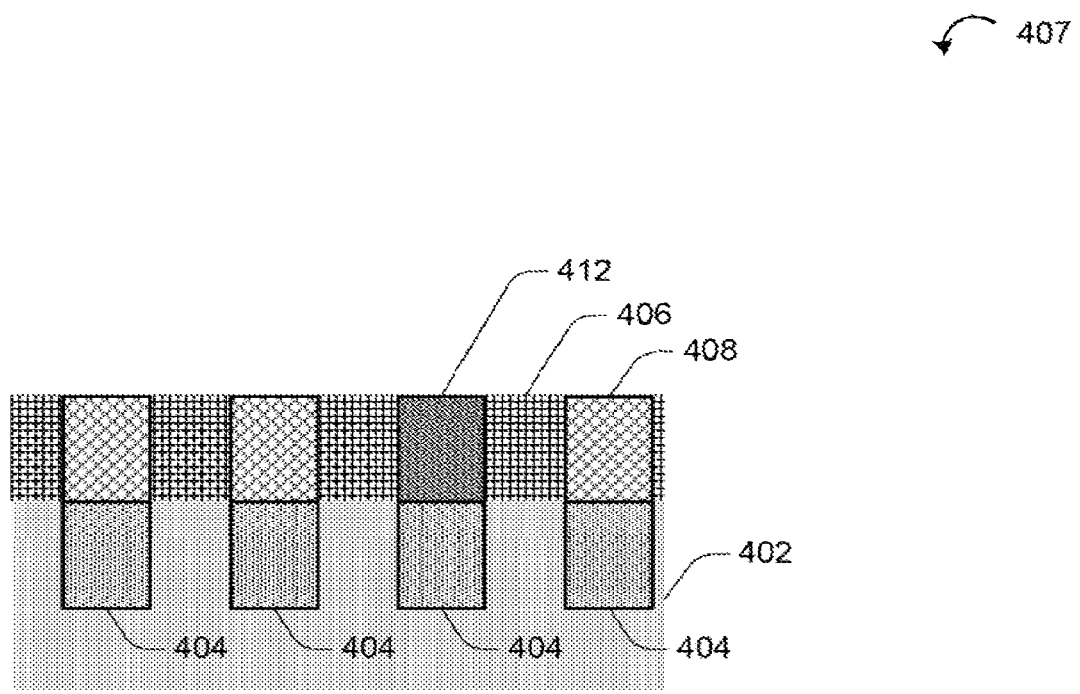

FIG. 4D illustrates an example cross-sectional view of an intermediate result of a processing sequence for the fabrication of a portion of the interconnect in accordance with one or more embodiments of the disclosure. In one embodiment, a first ILD 402 can be provided. In another embodiment one or more interconnect lines (for example, one or more metal interconnect lines) 404 can be formed in the first ILD 402. In one embodiment, a first DSA material 406 and a second DSA material 408 can be formed and/or disposed on the first ILD 402 and the one or more interconnect lines 404.

In one embodiment, the interconnect 407 can include a sacrificial member 412 that may be formed in the via trench 410 as shown and described in connection with FIG. 4C. The sacrificial member 412 may act as a temporary placeholder for a via that will be formed in further processing steps (to be discussed below). In one embodiment the sacrificial member 412 can include a titanium nitride (TiN) material. The sacrificial member 412 can further include any sacrificial conductive and/or nonconductive material including, but not limited to, amorphous silicon, any metal oxide, and/or titanium nitride (TiN), and/or titanium (Ti). In one embodiment, the sacrificial member can be formed by any suitable method including, but not limited to, chemical vapor deposition (CVD) and/or plasma enhanced chemical vapor deposition (PECVD). In one embodiment, the sacrificial member 412 can be patterned using a mask during the deposition of the sacrificial member 412. In another embodiment, the sacrificial via 412 can be etch-selective to the etching of the first ILD 402. In one embodiment, the sacrificial member 412 can prevent punch-through to the metal layers in one or more interconnect lines 404 below, for example, during a via etching step to be described below.

Figure 4E:
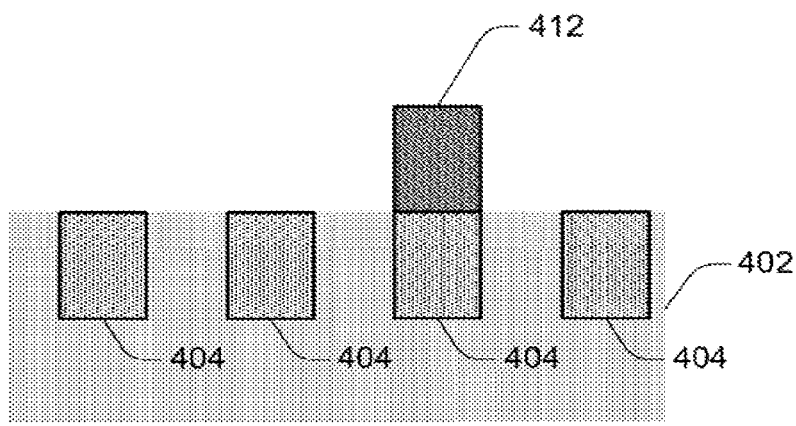

FIG. 4E illustrates an example cross-sectional view of an intermediate result of a processing sequence for the fabrication of a portion of the interconnect in accordance with one or more embodiments of the disclosure. In one embodiment, the interconnect 409 can include a first ILD 402. In another embodiment, the interconnect 409 can include one or more interconnect lines (for example, one or more metal interconnect lines) 404 that may be formed in the first ILD 402. In one embodiment, the interconnect 409 can include a sacrificial member 412 that may be disposed on the metal interconnect line 404.

In various embodiments, the first DSA material 406 and the second DSA material 408 can be removed by any suitable method from the structure depicted in FIG. 4D and related description. In various embodiments, the removal of the first DSA material 406 and second DSA material 408 can be performed using any suitable method including, but not limited to, etching, dry etching, wet etching and the like. In one embodiment, the etching of the first DSA material 406 and the second DSA material 408 can be selective with respect to the sacrificial member 412, the first ILD 402, and/or the one or more interconnect lines 404. That is, the first DSA material 406 and the second DSA material 408 may not further etch the sacrificial member 412, the first ILD 402, and/or the one or more interconnect lines 404.

Figure 4F:
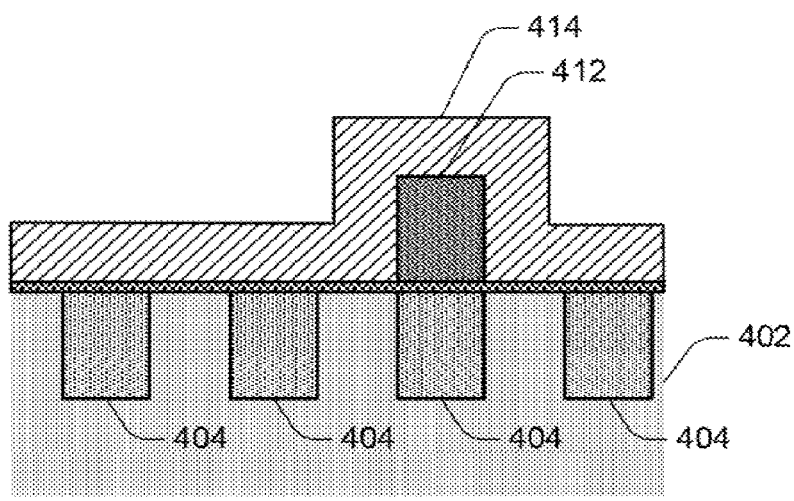
Figure 4F:
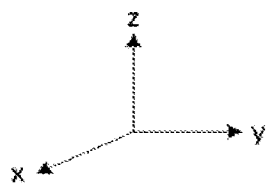

FIG. 4F illustrates an example cross-sectional view of an intermediate result of the processing sequence for the fabrication of a portion of the interconnect in accordance with one or more embodiments of the disclosure. In one embodiment, a interconnect 411 includes a first ILD 402. In another embodiment, the two layer interconnect includes one or more interconnect lines (for example, one or more metal interconnect lines) 404 that may be formed in the first ILD 402.

In one embodiment, the interconnect 411 can include a sacrificial member 412, that may be disposed on the first ILD 402 and the one or more interconnect lines 404. In one embodiment, a spacer layer 414, may be disposed on the sacrificial member 412 and the first ILD 402 and the one or more interconnect lines 404. In one embodiment, the spacer layer 414 can be a non-conductive material. In another embodiment the spacer layer 414 can include a permanent (for example non-sacrificial) material. In another embodiment the sacrificial member 414 can be set etch selective/orthogonal to the first ILD 402 in one embodiment. The sacrificial member 402 can be deposited by any suitable process including, but not limited to, CVD, PECVD and/or atomic-layer deposition (ALD). In one embodiment, the thickness of the spacer layer 414 can be greater than or equal to approximately one-half the thickness of the spacing between adjacent interconnect lines in the one or more interconnect lines 404. In one embodiment the spacer layer 414 can include a metal oxide material, for example, a silicon dioxide material $SiO_2$. In another embodiment, the spacer layer 414 and may be conformal to facilitate deposition around the tight-pitch topography of the underlying layers.

Figure 4G:
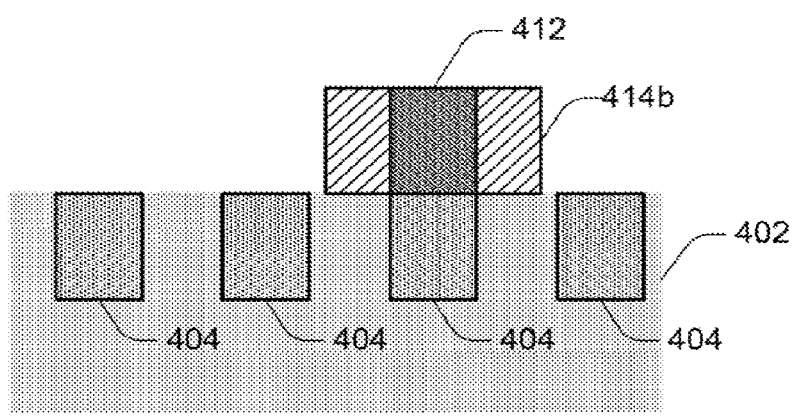

FIG. 4G illustrates an example cross-sectional view of an intermediate result of the processing sequence for the fabrication of a portion of the interconnect in accordance with one or more embodiments of the disclosure. In one embodiment, the two layer interconnect 413 can include a first ILD 402. In another embodiment, the interconnect can include a one or more interconnect lines (for example, one or more metal interconnect lines) 404. In one embodiment, the interconnect 413 can include a sacrificial member 412 that may be disposed on the first ILD 402 and the one or more interconnect lines 404. In one embodiment, the interconnect 413 can include a spacer layer 414 that may be disposed on the first ILD 402 and the one or more interconnect lines 404.

The spacer layer 414, as shown in FIG. 4F, can be partially removed as shown and described in FIG. 4G. In one embodiment, the removal of the spacer layer 414 can be performed by an etching step. In one embodiment, the etching step can include a dry etch and/or a wet etch. In one embodiment, the etching can be directional on the spacer layer 414 (for example, only etched downward in the downward direction with respect to the z axis). In one embodiment, the etching of the spacer layer 310 can be performed using a hydrofluoric acid (HF) etch or may be performed by a dry etch. In subsequent steps, for example, in steps shown and described below in connection with FIGS. 4H-4M, the spacer layer 414 may act as a hard mask blocking regions with tight pitch features and allowing other regions to be etched downstream.

Figure 4H:
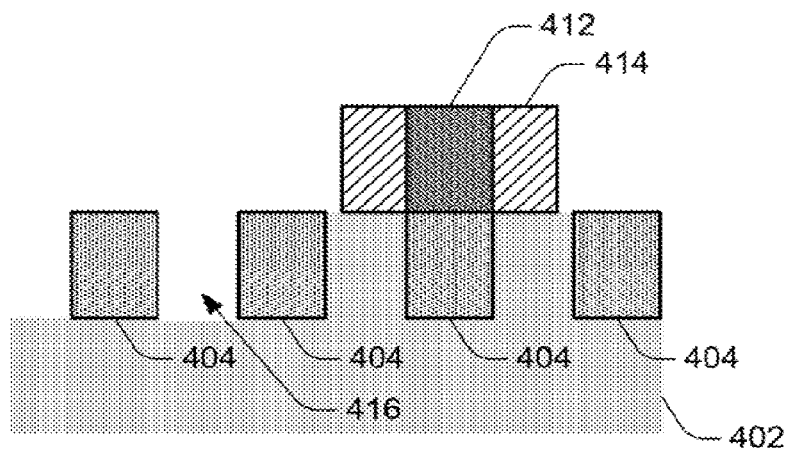

FIG. 4H illustrates an example cross sectional view of processing sequence for the fabrication of a portion of the interconnect in accordance with one or more embodiments of the disclosure. In one embodiment, the interconnect 415 may include a first ILD 402. In another embodiment, the interconnect 415 can include one or more interconnect lines 404 (one or more metal interconnect lines) that may be formed in the first ILD 402. In one embodiment, the interconnect 415 can include a sacrificial member 412 that may be disposed on the first ILD 402 and the one or more interconnect lines 404. In another embodiment, the interconnect can include a spacer layer 414 that may be disposed on the first ILD 402 and the one or more interconnect lines 404.

In various embodiments, the interconnect can include a gap 416, for example, an air gap. In one embodiment, the gap 416 can be can be produced by the removal of the portion of the first ILD 402. For example, in one embodiment the gap 416 can be produced by an etching step on the first ILD 402. In one embodiment, the etching of the first ILD 402 can be selective with respect to the spacer layer 414, the sacrificial member 412, and/or the one or more interconnect lines 404. That is, the etching of the first ILD 402 may not further etch the spacer layer 414, the sacrificial member 412, and/or the one or more interconnect lines 404.

In one embodiment, the gap 416 can be partially or fully filled with any suitable material including, but not limited to, a gas, a liquid and/or a dielectric material. Such gaps 416 may act to reduce capacitance and thereby increase performance (circuit timing, power consumption, and the like) of the interconnect. In various embodiments, the gaps may include an air gap but they may additionally include any other gas (for example, nitrogen, helium, hydrogen, xenon, inert gasses, and so on), liquids, and/or dielectrics (for example low-K dielectrics). In one embodiment, such low-K dielectrics may be lower K with respect to other interlayer dielectric layers (IDLs) within the interconnect structure.

Figure 4I:
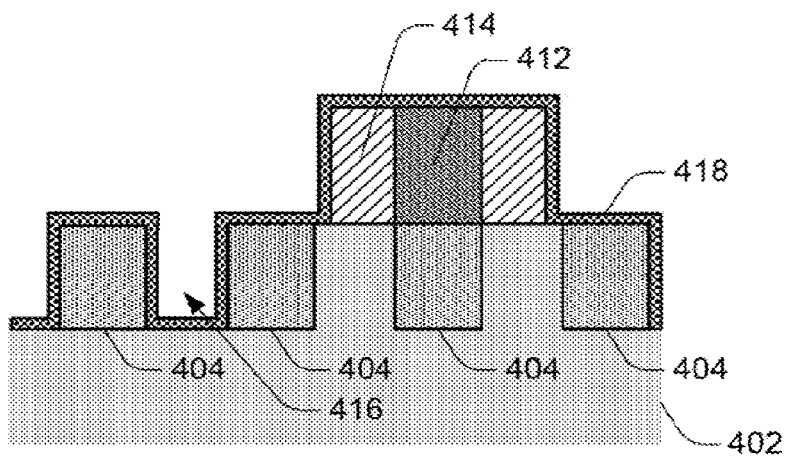

FIG. 4I depicts an example cross-sectional view of an intermediate result of the processing sequence for the fabrication of a portion of the two layer interconnect in accordance with one or more embodiments of a disclosure. In one embodiment, the two layer interconnect 417 can include a first ILD 402. In another embodiment, the interconnect 417 can include one or more interconnect lines (for example, one or more metal interconnect lines) 404. In one embodiment, the interconnect 417 can include a sacrificial member 412. In another embodiment, the interconnect 417 can include a spacer layer for a spacer layer 414.

In one embodiment, the interconnect can include a gap 416, for example, an air gap. In one embodiment, the interconnect 417 can include an etch stop layer 418. In various embodiments, the etch stop layer 418 can serve to hermetically seal the underlying layers including, but not limited to, the spacer layer 414, the sacrificial member 412, the first ILD 402 and the one or more interconnect lines 404. The etch stop layer 418 may further prevent the interdiffusion of metal (for example, metal from the one or more interconnect lines 404) and/or any other materials in proximate layers or in preceding steps or following steps in the processing sequence of the interconnect 417. In various embodiments the etch stop layer 418 can include a silicon nitride (SiN) material. The etch stop layer 418 may be deposited via any suitable mechanism, including but not limited to, chemical vapor deposition (CVD), physical evaporation chemical vapor deposition (PECVD) and/or by spin coating.

Figure 4J:
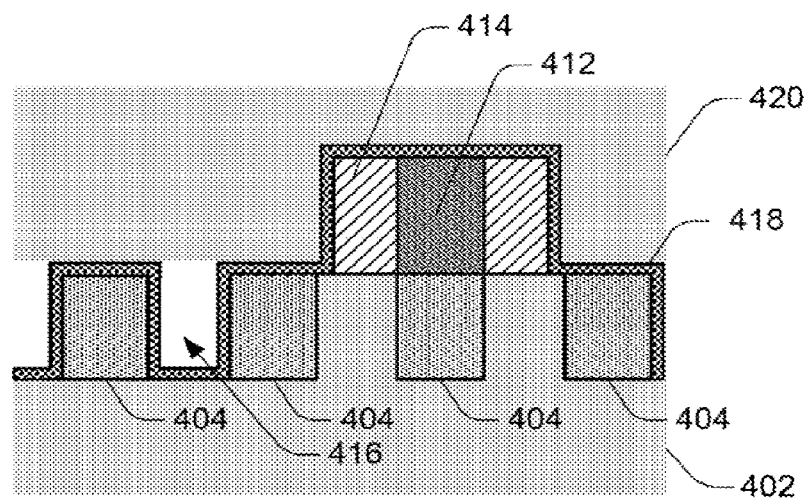

FIG. 4J illustrates an example cross-sectional view of an intermediate result of a processing sequence for the fabrication of a portion of the interconnect in accordance with one or more embodiments of the disclosure. In one embodiment, the interconnect 419 can include a first ILD 402. In another embodiment, the interconnect 419 can include one or more interconnect lines (for example, one or more metal interconnect lines 404). In one embodiment, the interconnect 419 can include a sacrificial member 412. In another embodiment, the interconnect 419 can include a spacer layer 410. In one embodiment, the interconnect can include a gap 416, for example, an air gap. In various embodiments, the interconnect 419 can include an etch stop layer 418.

In various embodiments, the interconnect 419 can include a second ILD 420. The second ILD 420 can be disposed on the etch stop layer 418, the sacrificial member 412, the spacer layer 410, the air gap 416, the first ILD 402 and the one or more interconnect lines 404.

In one embodiment, the sacrificial member 412 can be disposed on the one or more interconnect lines 404. In one embodiment, the etch stop layer can be disposed on the sacrificial member 412, the spacer layer 410 of the one or more interconnect lines 404 and the first ILD 402.

In one embodiment, the second ILD 420 can include a back-filled ILD. In one embodiment, the second ILD 420 may be a permanent and/or a non-conformal dielectric layer. The second ILD 420 may be deposited via any suitable mechanism, including but not limited to, chemical vapor deposition (CVD), physical evaporation chemical vapor deposition (PECVD) and/or by spin coating. In another embodiment, the second ILD 420 can be disposed via a filling step and a polishing step. In one embodiment, the deposition of the second ILD 420 can cause the enclosure of one or more gaps 416, for example, air gaps. As mentioned, the presence of these gaps 416 can reduce the capacitance of the interconnects and thereby promote and enhance the performance of the interconnect, for example, the timing and/or the power consumption of the interconnect.

Figure 4K:
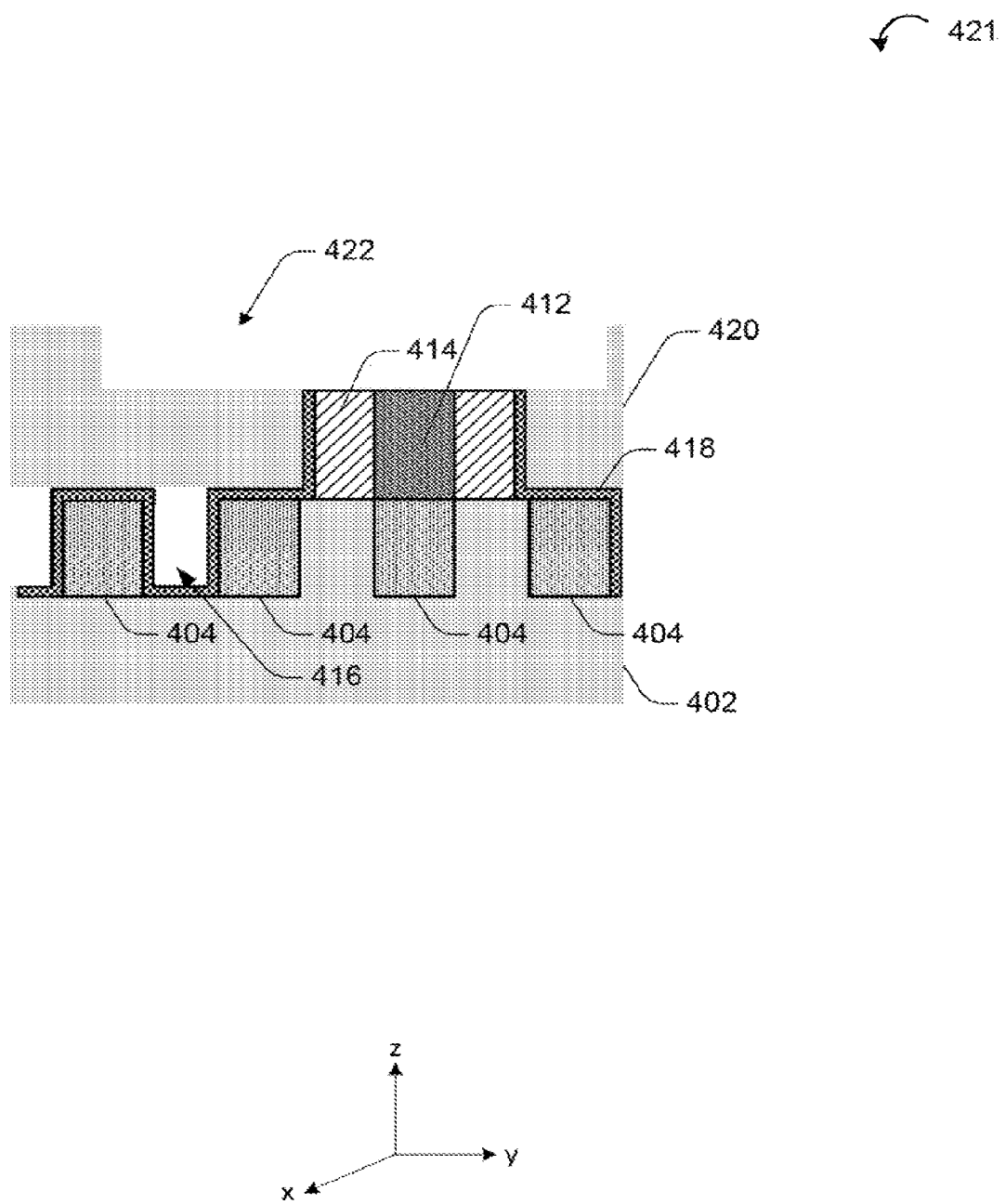

FIG. 4K illustrates an example cross-sectional view of an intermediate result of a processing sequence for the fabrication of a portion of the interconnect in accordance with one or more embodiments of the disclosure. The interconnect 421 can include a first ILD 402. The interconnect can further include one or more interconnect lines (one or more metal interconnect lines) 404. The interconnect 421 can further include a spacer layer 410 that may be disposed on an etch stop layer 418, a first ILD 402 and one or more interconnect lines 404. The two layer interconnect 421 can further include an etch stop layer 418 that may be disposed on the first ILD 402 and the one or more interconnect lines (for example, one or more metal interconnect lines) 404.

The interconnect 421 can further include a second ILD 420 that may be disposed on the etch stop layer 418, the first ILD 402, the one or more interconnect lines 404. The second ILD 420 can further lead to the formation of one or more gaps 416 for example, one or more air gaps. The interconnect 421 can further include a sacrificial member 412. The sacrificial member 412 may be disposed on the etch stop layer 418 and the one or more interconnect lines 404.

In various embodiments, the interconnect 421 can include a removed portion of the second ILD 422. The patterning of the second ILD 420 to yield the removed portion of the second ILD 422 can be performed by any suitable method including, but not limited to, etching, wet etch and/or a dry etch. In another embodiment, the dry etch may have different chemical and/or mechanical components. In an embodiment, the etching of the second ILD 420 may be selective with respect to the spacer layer 410 and/or the sacrificial member 412. That is, the etching of the second ILD 420 may not further etch the spacer layer 410 and/or the sacrificial member 412. In one embodiment, the patterning of the second ILD 420 to yield the removed portion of the second ILD 422 can provide area and/or volume for the subsequent deposition of a metal layer as shown and discussed in FIG. 2M below and related discussion.

Figure 4L:
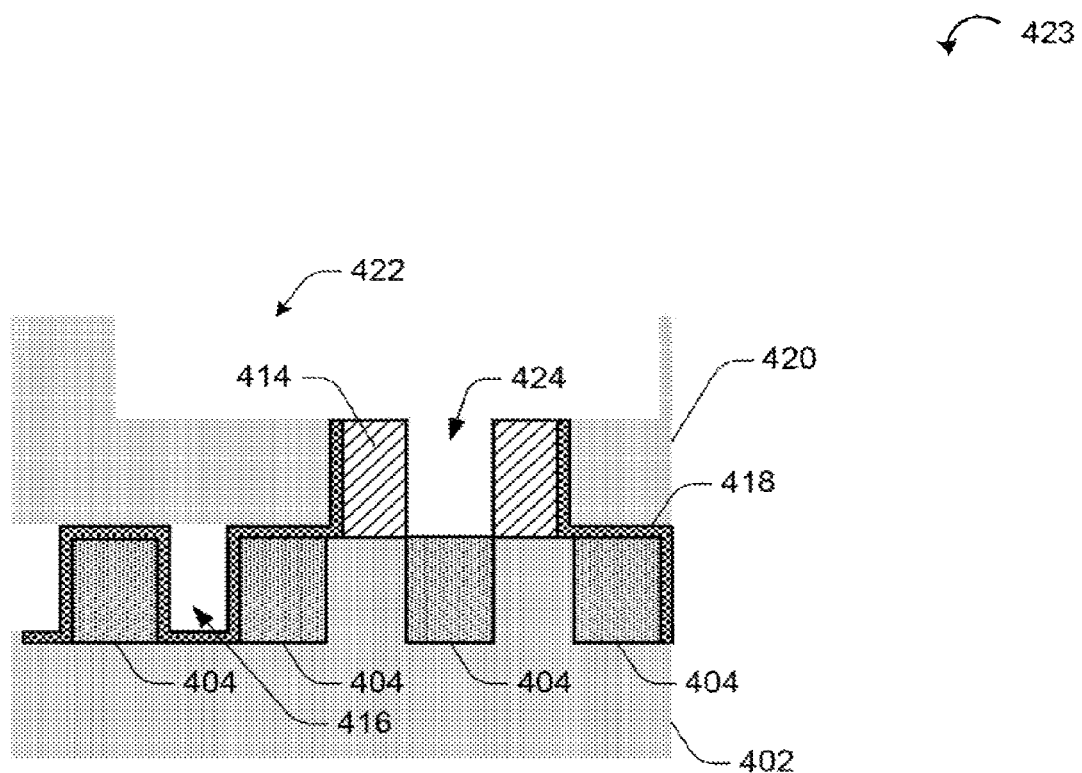

FIG. 4L illustrates an example cross-sectional view of an intermediate result of the processing sequence for the fabrication of a portion of the interconnect in accordance with one or more embodiments of the disclosure. In one embodiment, the interconnect 423 includes a first ILD 402. In another embodiment the interconnect 423 includes one or more interconnect lines 404 (for example, one or more metal interconnect lines). In one embodiment, the interconnect 423 includes a spacer layer 410. In one embodiment, the interconnect includes an etch stop layer 418 that may be disposed on the first ILD 402 and the one or more interconnect lines 404.

The interconnect 423 can further include a gap 416, for example, an air gap. The interconnect 423 can further include a second ILD 420 that may be disposed on the etch stop layer 418, the first ILD 402, the one or more interconnect lines 404 and the gap 416. The interconnect 423 can further include a removed portion of the second ILD 422. The interconnect 423 may further include a trench 424.

The removal of the sacrificial member 412 to yield the trench 424 can be performed using any suitable method including, but not limited to, etching. In one embodiment, the removal of the sacrificial member 412 of previous FIG. 4K can be done using any suitable method including, but not limited to, a wet etch and/or a dry etch. In another embodiment, the dry etch may have different chemical and/or mechanical components. In one embodiment, the etching of the sacrificial member 412 can be selective and/or orthogonal with respect to the spacer layer 410, and/or the one or more interconnect lines 404. That is, the etching of the of the sacrificial member 412 as depicted in previous FIG. 4K may not further etch the spacer layer 410 and/or the one or more interconnect lines 404. In one embodiment, the etching of the sacrificial member 412 to yield the trench 424 can additionally partially remove a portion of the etch stop layer 418 thereby exposing a portion of the one or more interconnect lines 404.

Figure 4M:
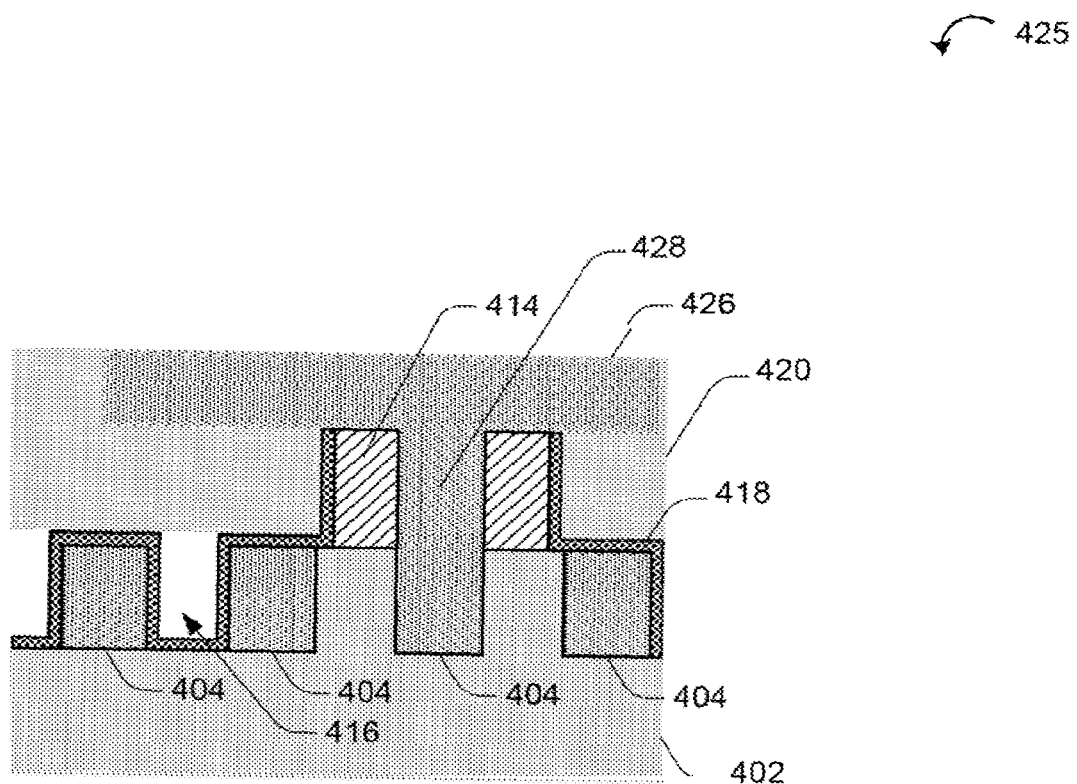

FIG. 4M illustrates an example cross-sectional view of an intermediate result of the processing sequence for the fabrication of a portion of the interconnect in accordance with one or more embodiments of the disclosure. In one embodiment, the interconnect 425 can include a first ILD 402. In another embodiment, a interconnect 425 can include one or more interconnect lines (for example, one or more metal interconnect lines 404). The interconnect 425 can include a spacer layer 410 that may be disposed on an etch stop layer 418, the first ILD 402 and one or more interconnect lines 404. The interconnect 425 can further include a gap 416, for example, an air gap. The interconnect 425 can further include a second ILD 420 that may be disposed on the etch stop layer 418, the first ILD 402 and the one or more interconnect lines 404.

The two layer interconnect 425 can further include a second metal layer 426 that may be disposed in the removed portion of the second ILD 422 as shown in FIG. 4L. In various embodiments, the second metal layer can fill the removed portion of the sacrificial member 424 as shown in FIG. 4L, thereby forming a filled via 428.

In one embodiment, the second metal layer 426 may be disposed via any suitable method, including CVD and/or PECVD. The deposition of the second metal layer 426 may further include an additional step of a deposition of an adhesion layer. The adhesion layer may be any suitable material, including, for example, titanium, tantalum, tungsten, molybdenum, titanium nitride, tantalum nitride, cobalt, cobalt-tungsten-boron, alloys of the aforementioned, combinations thereof, or the like. The deposition of the second metal layer 426 may further include an additional step of a deposition of a metal (for example, a copper layer), which may act as an adhesion promoter, enhance wetting between layers, and/or act as a metal seed layer. The metal seed layer may be deposited by any suitable technique, including but not limited to, electroplating. The metal seed layer may be deposited over the adhesion layer, in embodiments. The metal seed layer may be deposited by any suitable mechanism, such as a sputtering process. The metal seed can, in some embodiments, be deposited by PVD, CVD, evaporation, ALD, combinations thereof, or the like. The metal seed layer may be copper, cobalt, aluminum, combinations thereof, or the like.

Figure 5A:
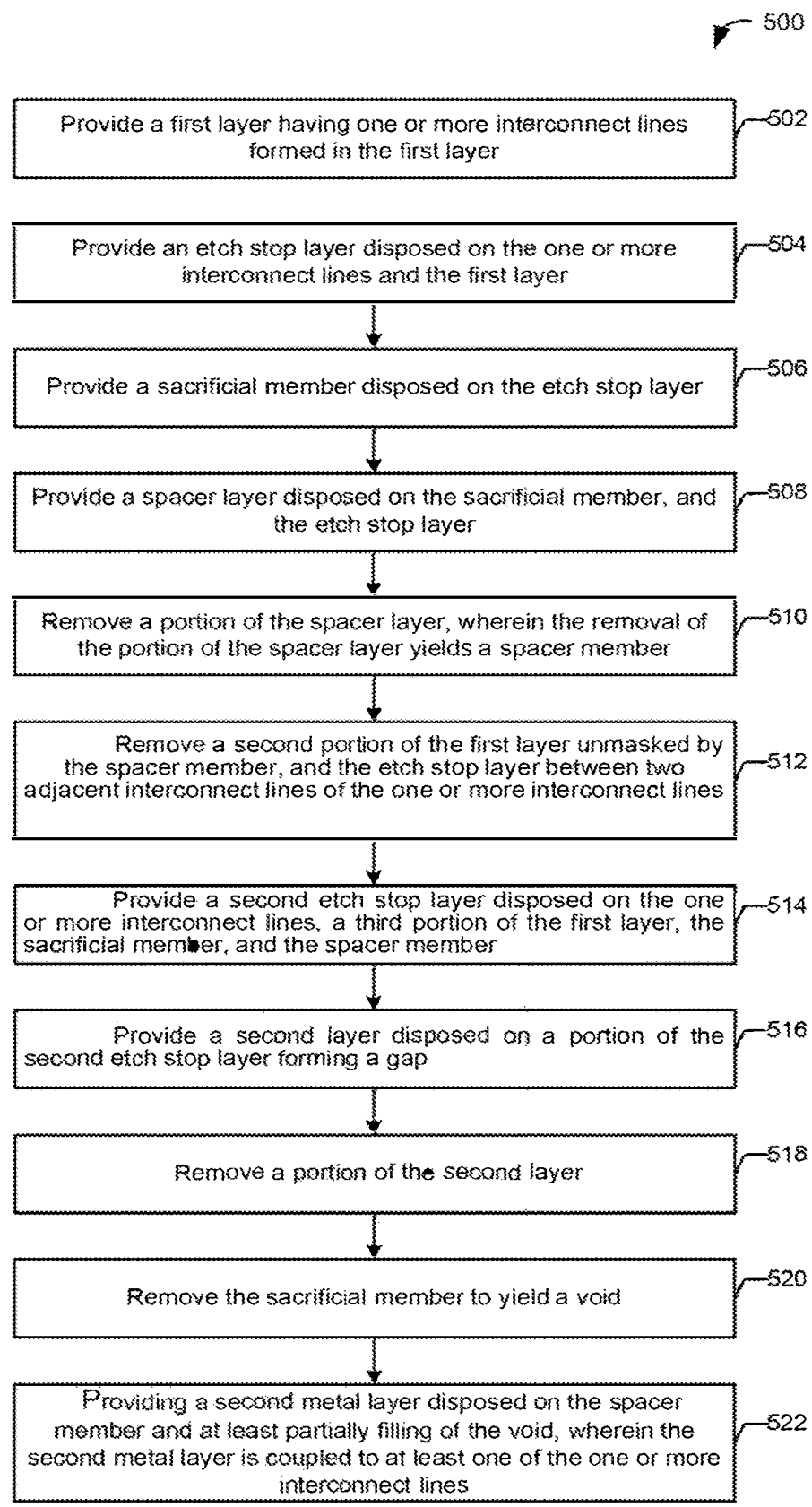
FIGS. 5A-5B depicts a flow diagram illustrating an example method for fabricating interconnects in accordance with example embodiments of the disclosure

FIG. 5A illustrates a diagram of an example processing flow for the fabrication of the interconnects in accordance with embodiments of the disclosure. It will be appreciated that some processes may be performed in an order different from that depicted herein. It will further be appreciated that some processes may have suitable substitutes that may be implemented without deviating from embodiments of the disclosure. In block 502, a first layer (for example, a first ILD) can be provided having one or more interconnect lines formed in the first layer. In one embodiment, the one or more interconnect lines may not extend above the level of the first layer.

The first ILD may be a permanent and/or a non-conformal dielectric layer. The first ILD may be deposited via any suitable mechanism, including but not limited to, chemical vapor deposition (CVD), physical evaporation chemical vapor deposition (PECVD) and/or by spin coating. The first ILD can have any suitable thickness, for example, the first ILD can have a thickness of approximately 5 nanometers to approximately 1000 nanometers with a preferential thickness of 30 nanometers to approximately 60 nanometers.

The interconnect can further include one or more interconnect lines (for example, one or more metal interconnect lines). The one or more interconnect lines can first be formed by producing or by fabricating a trench in the first ILD at the locations where the one or more vias are to be formed (not shown) later the trenches can be filled with metal.

In block 504, an etch stop layer may be provided, wherein the etch stop layer can be disposed on the one or more interconnect lines and the first layer (for example, a first ILD).

The etch stop layer can be used to hermetically seal the underlying layers (for example, the plurality of interconnect lines and/or the first ILD). The etch stop layer may further prevent the interdiffusion of metal (for example, metal from the one or more interconnect lines 204) and/or any other materials in proximate layers or in preceding steps or following steps in the processing sequence of the interconnect. In various embodiments the etch stop layer can include a silicon nitride (SiN) material.

In block 506, a sacrificial member can be provided, wherein the sacrificial member can be disposed on the etch stop layer.

The sacrificial member may act as a temporary placeholder for a via that will be formed in further processing steps (to be discussed below). In one embodiment the sacrificial member can include a titanium nitride (TiN) material. The sacrificial member can further include any sacrificial conductive and/or nonconductive material including, but not limited to, amorphous silicon, any metal oxide, and/or titanium nitride (TiN), and/or titanium (Ti). In one embodiment, the sacrificial member can be formed by any suitable method including, but not limited to, chemical vapor deposition (CVD) and/or plasma enhanced chemical vapor deposition (PECVD). In one embodiment, the sacrificial member can be patterned using a mask during the deposition of the sacrificial member. In another embodiment, the sacrificial via can be etch-selective to the first ILD etching. In one embodiment, the sacrificial member can prevent punch-through to the metal layers in one or more interconnect lines below In block 508, a spacer layer can be provided, wherein the spacer layer can be disposed on the sacrificial member, and the first layer.

In another embodiment, the spacer layer can be used to mask the underlying layers (for example, a portion of the etch stop layer, a portion of the one or more interconnect lines, and a portion of the first ILD) during various etching steps in the processing sequence for the fabrication of the interconnect. In one embodiment, the spacer layer can be a non-conductive material. In another embodiment the spacer layer can include a permanent (for example non-sacrificial) material. In another embodiment the sacrificial member can be set etch selective to the first ILD in one embodiment. The sacrificial member can be deposited by any suitable process including, but not limited to, CVD, PECVD and/or atomic-layer deposition (ALD). In one embodiment, the thickness of the spacer layer can be greater than or equal to approximately one-half the thickness of the spacing between adjacent interconnect lines in the one or more interconnect lines. In one embodiment the spacer layer can include a metal oxide material, for example, a silicon dioxide material $SiO_2$. In another embodiment, the spacer layer and may be conformal to facilitate deposition around the tight-pitch topography of the underlying layers.

In block 510, a portion of the spacer layer can be removed, wherein the removal of the portion of the spacer layer yields a spacer member.

The spacer layer may be etched in accordance with any suitable techniques disclosed herein. In one embodiment, the spacer layer can be etched via dry etched and/or a wet etch. In another embodiment, the spacer layer can be etched directionally, for example, only etched in the download direction with respect to the Z-axis.

As mentioned, the sacrificial member and/or the spacer layer can act as a mask blocking directly underlying regions with high pitch features thereby allowing unmasked regions to be etched in various processing sequence steps for the fabrication of a portion of the interconnect. In one embodiment, the etching of the spacer layer can be performed using a hydrofluoric acid (HF) etch or may be performed by a dry etch.

In block 512, a portion of the first layer (for example, a first ILD) not masked by the spacer member and the etch stop layer not masked by the spacer member can be removed. In one embodiment, forming a spatial relationship between adjacent interconnect lines of the one or more interconnect lines to define at least one gap.

In one embodiment, the removal can include an etching of the etch stop layer and/or the first ILD that may be selective to the etching of the spacer layer. In another embodiment, the etching of the etch stop layer and the first ILD may be done using any suitable method including a wet etch and/or dry etch. The etching of the spacer layer and the etch stop layer may cause a formation of a gap, for example, an air gap, in the first ILD.

In block 514, a second etch stop layer can be provided, wherein the second etch stop layer may be disposed on the one or more interconnect lines, the first layer and the spacer member.

The etch stop layer can be used to hermetically seal the underlying layers (for example, the plurality of interconnect lines and/or the first ILD, and/or the gap). The etch stop layer may further prevent the interdiffusion of metal (for example, metal from the one or more interconnect lines) and/or any other materials in proximate layers or in preceding steps or following steps in the processing sequence of the interconnect. In various embodiments the etch stop layer can include a silicon nitride (SiN) material. In one embodiment, the etch stop layer may be deposited using any suitable method including, but not limited to, CVD, PECVD and/or ALD.

In block 516, a second layer (for example, a second ILD) can be provided, wherein the second layer can be disposed on a portion of the second etch stop layer.

The second ILD can be a permanent and/or a nonconductive layer. In one embodiment, the deposition of the second ILD may lead to the enclosure of the gap (for example, air gaps). The second ILD can be deposited by any suitable method including, but not limited to, CVD, PECVD and/or spin coating. In one embodiment, the second ILD can have a thickness of approximately 5 nanometers to approximately 1,000 nanometers, where in some example, the thickness can range from approximately 30 nanometers to approximately 60 nanometers. In one embodiment the second ILD may be mechanically polished after deposition.

In block 518, a portion of the second layer (for example, a second ILD) can be removed.

The patterning of the second ILD to yield the patterned portion can be performed by any suitable method including, but not limited to, etching, wet etch and/or a dry etch. In another embodiment, the dry etch may have different chemical and/or mechanical components. In one embodiment, the etching of the first ILD can be selective and/or orthogonal with respect to the spacer layer, the sacrificial member, and/or the one or more interconnect lines. That is, the etching of the second ILD may not further etch the spacer layer, the sacrificial member, and/or the one or more interconnect lines.

In various embodiments, the patterning of the part of the second ILD may be done such that subsequent processing steps can fill the pattern part of the second ILD with a suitable material, for example, a metal layer, in order to complete the via structure In block 520, the sacrificial member can be removed to yield a void.

In one embodiment, the sacrificial member may be removed using any suitable technique. This can be done in order to allow for the subsequent filling of the area defined by the sacrificial member of previous steps with a metal layer. The removal of the sacrificial member can be done using any suitable method including, but not limited to, a wet etch and/or a dry etch. In another embodiment, the dry etch may have different chemical and/or mechanical components. In one embodiment, the etching of the sacrificial member of previous steps can be selective with respect to the spacer layer, and/or the one or more interconnect lines. That is, the etching of the of the sacrificial member of previous steps may not further etch the spacer layer and/or the one or more interconnect lines.

In block 522, a second metal layer can be provided, wherein the second metal layer may be disposed on the third layer and the spacer member and at least partially filling of the void, wherein the second metal layer can be coupled to at least one of the one or more interconnect lines.

In one embodiment, at least a portion of the second metal layer may be mechanically and/or electrically connected with the one or more interconnect lines. In one embodiment the second metal layer can form one or more vias, which were previously the site of the sacrificial member in preceding steps.

In one embodiment, the second metal layer may be disposed via any suitable method, including CVD and/or PECVD. The deposition of the second metal layer may further include an additional step of a deposition of an adhesion layer. The adhesion layer may be any suitable material, including, for example, titanium, tantalum, tungsten, molybdenum, titanium nitride, tantalum nitride, cobalt, cobalt-tungsten-boron, alloys of the aforementioned, combinations thereof, or the like. The deposition of the second metal layer may further include an additional step of a deposition of a metal (for example, a copper layer), which may act as an adhesion promoter, enhance wetting between layers, and/or act as a metal seed layer. The metal seed layer may be deposited by any suitable technique, including but not limited to electroplating. The metal seed layer may be deposited over the adhesion layer, in embodiments. The metal seed layer may be deposited by any suitable mechanism, such as a sputtering process. The metal seed in some embodiments, may be deposited by PVD, CVD, evaporation, ALD, combinations thereof, or the like. The metal seed layer may be copper, cobalt, aluminum, combinations thereof, or the like.

Figure 5B:
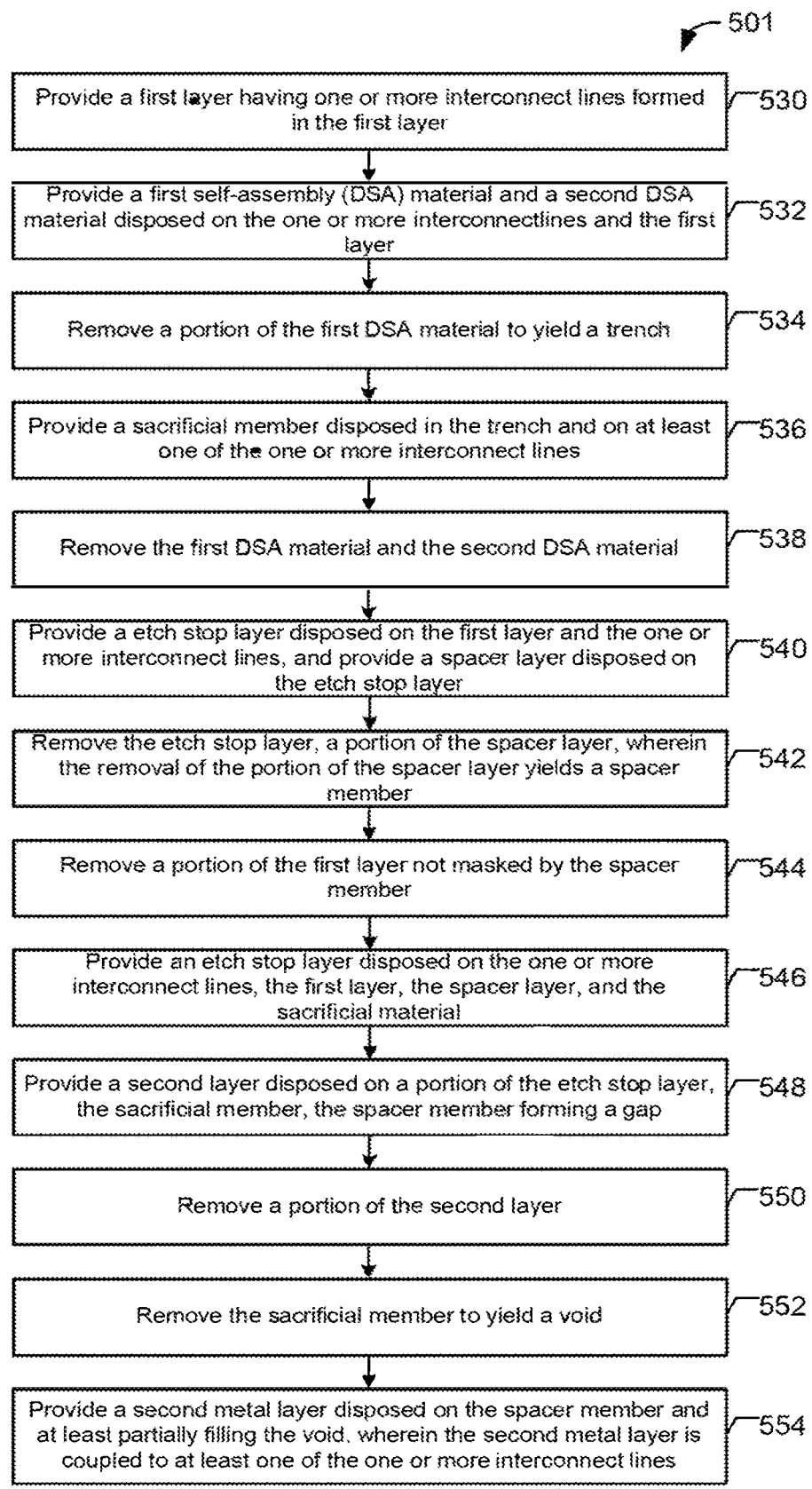

FIG. 5B illustrates a flowchart illustrates of an example method 501 for the fabrication of the interconnects in accordance with one or more embodiments of the disclosure. It is noted that some processes may be performed in an order different from that depicted herein. It is also noted that some processes may have suitable substitutes that may be implemented without deviating from embodiments of the disclosure.

In block 530, a first layer (for example, a first ILD) can be provided, wherein the first layer having one or more interconnect lines (for example, one or more metal interconnect lines) formed in the first layer. In one embodiment, the one or more interconnect lines do not extend above the height level of the first layer, with respect to the z-axis.

In one embodiment, the first layer (for example, the first ILD) may be a permanent and/or a non-conformal dielectric layer. In another embodiment, the first layer may be deposited via any suitable mechanism, including but not limited to, chemical vapor deposition (CVD), physical evaporation chemical vapor deposition (PECVD) and/or by spin coating. In one embodiment, the first layer can have any suitable thickness, for example, the first layer can have a thickness of approximately 5 nm to approximately 1000 nm with an example thickness of 30 nanometers to approximately 60 nanometers.

In one embodiment, one or more interconnect lines (for example, one or more metal interconnect lines) can first be formed by producing or by fabricating a trench in the first ILD at the locations where the one or more vias are to be formed later the trenches can be filled with metal.

In block 532, a first direct self-assembly (DSA) material and a second DSA material can be provided, wherein the first DSA material and the second DSA material may disposed on the one or more interconnect lines and the first layer (for example, the first ILD).

In another embodiment, a first DSA material and a second DSA material may be disposed on the one or more interconnect lines and the first ILD. In one embodiment the first DSA material and the second DSA material may be formed by any suitable DSA method. In one embodiment, the DSA method can include two sacrificial polymers, for example, polystyrene and poly(methyl methacrylate) (PMMA) that do not mix with one another. In another embodiment the two polymers may be deposited sequentially, for example, a first thin layer of the first polymer may be deposited first followed by a thicker deposition of the second polymer onto the one or more interconnect lines and the first ILD. The two polymer materials may act as a template for the deposition of more permanent materials. In one embodiment, the two permanent materials can include, for example, silicon dioxide ($SiO_2$) and silicon nitride (SiN), that may replace the first DSA material and the second DSA material. In another embodiment, the permanent materials that are formed as the first DSA materials and the second DSA materials can be etch selective between one another. Further, the first DSA material and the second DSA material can be self-aligned to the one or more interconnect lines that are underneath the first and second DSA material.

In block 534, a portion of the first DSA material can be removed to yield a trench. In one embodiment, a via trench can further be formed by etching the second DSA material. In one embodiment, the process of opening the via trench can include any suitable method including, but not limited to, a wet etch process and/or a dry etch process. In another embodiment, the dry etch may have one or more chemical and/or mechanical components. In one embodiment, the etching of the second DSA material can be selective and/or orthogonal with respect to the first DSA material, the first ILD, and/or the one or more interconnect lines. That is, the etching of the second ILD may not further etch the first DSA material, the first ILD, and/or the one or more interconnect lines. In one embodiment, the patterning of the second DSA material to produce the via trench can provide area and/or volume for the subsequent deposition of a sacrificial member.

In block 536, a sacrificial member can be provided, wherein the sacrificial member may be disposed in the trench and on at least one of the one or more interconnect lines.

In one embodiment, the interconnect can include a sacrificial member that may be formed in the via trench as described in connection with previous blocks in method 501. The sacrificial member may act as a temporary placeholder for a via that will be formed in further processing steps (to be discussed below). In one embodiment the sacrificial member can include a titanium nitride (TiN) material. The sacrificial member can further include any sacrificial conductive and/or nonconductive material including, but not limited to, amorphous silicon, any metal oxide, and/or titanium nitride (TiN), and/or titanium (Ti). In one embodiment, the sacrificial member can be formed by any suitable method including, but not limited to, CVD and/or PECVD. In one embodiment, the sacrificial member can be patterned using a mask during the deposition of the sacrificial member. In another embodiment, the sacrificial via can be etch-selective to the etching of the first ILD. In one embodiment, the sacrificial member can prevent punch-through to the metal layers in one or more interconnect lines below, for example, during a via etching step to be described in connection with blocks below.

In block 538, the first DSA material and the second DSA material can be removed.

In various embodiments, the first DSA material and the second DSA material can be removed by any suitable method. In various embodiments, the removal of the first DSA material and second DSA material can be performed using any suitable method including, but not limited to, etching, dry etching, wet etching and the like. In one embodiment, the etching of the first DSA material and the second DSA material can be selective with respect to the sacrificial member, the first ILD, and/or the one or more interconnect lines. That is, the first DSA material and the second DSA material may not further etch the sacrificial member, the first ILD, and/or the one or more interconnect lines.

In block 540, an etch stop layer can be disposed on the first layer and the one or more interconnect lines, and a spacer layer can be disposed on the etch stop layer.

In one embodiment, a spacer layer, may be thus proximate to the sacrificial member and the first ILD and the one or more interconnect lines. In one embodiment, the spacer layer can be a non-conductive material. In another embodiment the spacer layer can include a permanent (for example non-sacrificial) material. In another embodiment the sacrificial member can be set etch selective/orthogonal to the first ILD in one embodiment. The sacrificial member can be deposited by any suitable process including, but not limited to, CVD, PECVD and/or atomic-layer deposition (ALD). In one embodiment, the thickness of the spacer layer can be greater than or equal to approximately one-half the thickness of the spacing between adjacent interconnect lines in the one or more interconnect lines. In one embodiment the spacer layer can include a metal oxide material, for example, a silicon dioxide material $SiO_2$. In another embodiment, the spacer layer and may be conformal to facilitate deposition around the tight-pitch topography of the underlying layers.

In block 542, the etch stop layer, and a portion of the spacer layer can be removed, wherein the removal of the portion of the spacer layer can yield a spacer member.

In one embodiment, the removal of the etch stop layer and/or the spacer layer can be performed by an etching step. In one embodiment, the etching step can include a dry etch and/or a wet etch. In one embodiment, the etching can be directional on the spacer layer (for example, only etched downward in the downward direction with respect to the z axis). In one embodiment, the etching of the spacer layer can be performed using a HF etch. In subsequent steps, for example, in steps described below in connection with future blocks, the spacer layer may act as a hard mask blocking regions with tight pitch features and allowing other regions to be etched downstream.

In block 544, a portion of the first layer not masked by the spacer member can be removed. In one embodiment, the removal of the portion of the first layer can form a spatial relationship to define at least one gap between adjacent interconnect lines of the one or more interconnect lines.

In various embodiments, the interconnect can include a gap, for example, an air gap (for example, the air gap 212 and/or the air gap 312 of FIGS. 2 and 3, respectively). In one embodiment, the gap can be can be produced by the removal of the portion of the first ILD. For example, in one embodiment the gap can be produced by an etching step on the first ILD. In one embodiment, the etching of the first ILD can be selective with respect to the spacer layer, the sacrificial member, and/or the one or more interconnect lines. That is, the etching of the first ILD may not further etch the spacer layer, the sacrificial member, and/or the one or more interconnect lines.

In one embodiment, the gap defined by the interconnect can be partially or fully filled with any suitable material including, but not limited to, a gas, a liquid, and/or a dielectric material. Such gaps may reduce capacitance and thereby increase performance (circuit timing, power consumption, and the like) of the interconnect. In various embodiments, the gaps may include air but they may additionally include any other gas (for example, nitrogen, helium, hydrogen, xenon, inert gasses, and so on), liquids, and/or dielectrics (for example low-K dielectrics). In one embodiment, such low-K dielectrics may be lower K with respect to other interlayer dielectric layers (IDLs) within the interconnect structure.

In block 546, an etch stop layer can be provided, wherein the etch stop layer can be disposed on the one or more interconnect lines, the first layer, the spacer layer, and the sacrificial member.

In various embodiments, the etch stop layer can serve to hermetically seal the underlying layers including, but not limited to, the spacer layer, the sacrificial member, the first ILD and the one or more interconnect lines. The etch stop layer may further prevent the interdiffusion of metal (for example, metal from the one or more interconnect lines) and/or any other materials in proximate layers or in preceding steps or following steps in the processing sequence of the interconnect. In various embodiments the etch stop layer can include a silicon nitride (SiN) material. The etch stop layer may be deposited via any suitable mechanism, including but not limited to, CVD, PECVD and/or by spin coating.

In block 548, a second layer (for example, a second ILD) can be provided, wherein the second layer can be disposed on a portion of the etch stop layer, the sacrificial member, and the spacer member.

In one embodiment, the second ILD can include a back-filled ILD. In one embodiment, the second ILD may be a permanent and/or a non-conformal dielectric layer. The second ILD may be deposited via any suitable mechanism, including but not limited to, CVD PECVD and/or by spin coating. In another embodiment, the second ILD can be disposed via a filling step and a polishing step. In one embodiment, the deposition of the second ILD can cause the enclosure of one or more gaps, for example, air gaps. As mentioned, the presence of these gaps can reduce the capacitance of the interconnects and thereby promote and enhance the performance of the interconnect, for example, the timing and/or the power consumption of the interconnect.

In block 550, a portion of the second layer can be removed. In various embodiments, the interconnect can include a removed portion of the second ILD. The patterning of the second ILD to yield the removed portion of the second ILD can be performed by any suitable method including, but not limited to, etching, wet etch and/or a dry etch. In another embodiment, the dry etch may have different chemical and/or mechanical components. In an embodiment, the etching of the second ILD may be selective with respect to the spacer layer and/or the sacrificial member. That is, the etching of the second ILD may not further etch the spacer layer and/or the sacrificial member. In one embodiment, the patterning of the second ILD to yield the removed portion of the second ILD can provide area and/or volume for the subsequent deposition of a metal layer as described in connection with future blocks below.

In block 552, the sacrificial member can be removed to yield a void. The removal of the sacrificial member to yield the trench can be performed using any suitable method including, but not limited to, etching. In one embodiment, the removal of the sacrificial member can be done using any suitable method including, but not limited to, a wet etch and/or a dry etch. In another embodiment, the dry etch may have different chemical and/or mechanical components. In one embodiment, the etching of the sacrificial member can be selective with respect to the spacer layer, and/or the one or more interconnect lines. That is, the etching of the sacrificial member may not further etch the spacer layer and/or the one or more interconnect lines. In one embodiment, the etching of the sacrificial member to yield the trench can additionally partially remove a portion of the etch stop layer thereby exposing a portion of the one or more interconnect lines.

In block 554, a second metal layer can be provided, wherein the second metal layer can be disposed on the spacer member and can at least partially fill the void, and wherein further, the second metal layer can be coupled to at least one of the one or more interconnect lines.

In one embodiment, the second metal layer may be disposed via any suitable method, including CVD and/or PECVD. The deposition of the second metal layer may further include an additional step of a deposition of an adhesion layer. The adhesion layer may be any suitable material, including, for example, titanium, tantalum, tungsten, molybdenum, titanium nitride, tantalum nitride, cobalt, cobalt-tungsten-boron, alloys of the aforementioned, combinations thereof, or the like. The deposition of the second metal layer may further include an additional step of a deposition of a metal (for example, a copper layer), which may act as an adhesion promoter, enhance wetting between layers, and/or act as a metal seed layer. The metal seed layer may be deposited by any suitable technique, including but not limited to electroplating. The metal seed layer may be deposited over the adhesion layer, in embodiments. The metal seed layer may be deposited by any suitable mechanism, such as a sputtering process. The metal seed can, in some embodiments, be deposited by PVD, CVD, evaporation, ALD, combinations thereof, or the like. The metal seed layer may be copper, cobalt, aluminum, combinations thereof, or the like.

In various embodiments, the interconnects described in the disclosure can be used in connection with backend of line (BEOL) processing. BEOL can refer to a portion of IC fabrication where individual devices (transistors, capacitors, resistors, etc.) are interconnected with wiring. BEOL can include contacts, insulating layers (dielectrics), metal levels, and bonding sites for chip-to-package connections. In the BEOL part of fabrication stage contacts (pads), interconnect wires, vias and dielectric structures may be formed. For some IC processes, more than 10 metal layers can be added in the BEOL.

In various embodiments, the disclosed interconnects can be used in connection with an electronic component. The electronic components may be any suitable electronic components, including, but not limited to, integrated circuits, surface mount devices, active devices, passive devices, diodes, transistors, connectors, resistors, inductors, capacitors, microelectromechanical systems (MEMSs), combinations thereof, or the like.

In one embodiment, the interconnects may provide electrical pathways for signals between electronic components (for example, integrated circuits, passive devices, etc.), input/output (I/O) connections on the semiconductor package, signal fan out from/to the electronic components, signal connections between two or more electrical components, power delivery to electrical component(s), ground connections to electrical component(s), clock signal delivery to the electrical component(s), combinations thereof, or the like.

In one embodiment, a substrate as referenced herein can refer to a solid (which is some embodiments can be planar) substance onto which a layer of another substance is applied, and to which that second substance adheres. The substrate can be a thin slice of material such as silicon, silicon dioxide, aluminum oxide, sapphire, germanium, gallium arsenide (GaAs), an alloy of silicon and germanium, or indium phosphide (InP). These serve as the foundation upon which electronic devices such as transistors, diodes, and especially integrated circuits (ICs) are deposited.

In various embodiments, the plurality of interconnect lines and/or second metal layers can comprise a metallic, semi-metallic, or intermetallic material. In various embodiments, the plurality of interconnect lines and/or second metal layers can comprise a metallic material. Non-limiting examples include gold, copper, silver, aluminum, zinc, tin, platinum, and any of the like. Metallic materials may also be any alloys of such materials.

In various embodiments, the plurality of interconnect lines and/or second metal layers can comprise a semi-metallic material. Non-limiting examples include arsenic, antimony, bismuth, α-tin (gray tin) and graphite, and mercury telluride (HgTe). Semi-metallic materials may also be any mixtures of such materials.

In various embodiments, the plurality of interconnect lines and/or second metal layers can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

In various embodiments, the plurality of interconnect lines and/or second metal layers may be deposited by any suitable mechanism including, but not limited to, metal foil lamination, physical vapor deposition, chemical vapor deposition, sputtering, metal paste deposition, combinations thereof, or the like.

In an embodiment, the one or more vias may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like.

In some embodiments, the hard mark layer disclosed herein may include any suitable material, such as silicon nitride, silicon dioxide, silicon oxynitride, silicon carbonitride, silicon carbide, silicon oxycarbonitride, spin-on silicate glass films, polymeric dielectric films, non-stoichiometric variations of the aforementioned films, combinations thereof, or the like. The hard mask layer may be deposited by any suitable mechanism including plasma enhanced PECVD, CVD, spin-on processes, spray coating processes, physical vapor deposition (PVD), combinations thereof, or the like. In some embodiments, the hard mask layer may be a silicon nitride film of a thickness in the range of about 20 nanometers to about 1 micron, such as at a thickness of 200 nm. The silicon nitride hard mask layer may be deposited by a PECVD system, such as with silane/ammonia ($SiH_4/NH_3$) based feed gas in a microwave plasma, such as a downstream plasma system. Alternatively, the silicon nitride hard mask layer may be formed in any suitable plasma CVD system, such as capacitively-coupled plasma, inductively-coupled plasma, high density plasma, magnetically enhanced plasma, etc. In some embodiments, the hard mask layer may be etched using a permanganate etch solution, a phosphoric acid solution, or indeed any suitable etch for removal of the hard mask layer.

The ILD layers may be of any suitable material properties (for example, k value, leakage properties, etc.) and thicknesses. For example, relatively low-k pre-preg ILD layers may be used to allow for high-frequency, low signal degradation signaling. In some embodiments, ILD layers may include laminate ILD layers with a thickness in the range of about 25 microns (μm) to about 100 μm and metal layers in the range of about 10 μm to about 40 μm.

In some embodiments, the spacer layers and/or the ILDs may be removed by a plasma etch process, such as a magnetically enhanced reactive ion etch (MERIE), high density plasma (HDP), or indeed any suitable plasma etch process. In some embodiments, the spacer layers and/or the ILDs may have filler materials, resins, and/or other elements to make the spacer layers and/or the ILDs more resistant to plasma etching. Any suitable type of plasma system may be used including, but not limited to, capacitively-coupled, inductively-coupled, microwave plasma, upstream plasma, combinations thereof, or the like. Any suitable etch gases may be used, for example, fluorinated gases, such as tetrafluoromethane, hexafluoroethane, octafluoropropane, octafluorocyclobutane, herafluoro-1,3-butadiene, combinations thereof, or the like. Additionally, other gases for promoting polymerization and/or etching, as well as carrier gases may be used, such as oxygen, hydrogen, carbon dioxide, nitrogen, argon, helium, combinations thereof, or the like.

In order to fabricate the various build-up (for example, ILD), spacer, and/or metal layers described herein, various fabrication steps can be performed, including steps to deposit/laminate the layers, expose the deposited/laminated layers to radiation, develop layers, cure the layers, and pattern the layers. In one embodiment, processing the build-up (for example, ILD), spacer, and/or metal layers can further include exposing the layers using a mask. The mask can include, for example, a photomask, which can refer to an opaque plate with holes or transparencies that allow light to shine through in a defined pattern. In one embodiment, the photomask can include transparent fused silica blanks covered with a pattern defined with a chrome metal-absorbing film. In another embodiment, the photomask can be used at a predetermined wavelength, including but not be limited to, approximately 436 nm, approximately 365 nm, approximately 248 nm, and approximately 193 nm. In one embodiment, there can be a one-to-one correspondence between the mask pattern and the layer pattern, for example, using one-to-one mask aligners. In other embodiments, steppers and scanners with reduction optics can be used to project and shrink the pattern by four or five times onto the surface of the layers. To achieve complete coverage, the photoimageable dielectric layer is repeatedly "stepped" from position to position under the optical column until full exposure is achieved.

In one embodiment, processing the build-up (for example, ILD), spacer, and/or metal layers can further include developing the layers using an ultraviolet light source. In one embodiment, the light types that can be used to image the layers can include, but not be limited to UV and DUV (Deep UV) with the g and I interconnect lines having wavelength of approximately 436 nm and approximately 365 nm, respectively, of a mercury-vapor lamp. In various embodiments, the development of the layers can include an exposure to the ultraviolet light source for a few seconds through the mask. The areas of the layers which are exposed stay, and the rest of the layers are developed.

In one embodiment, the developing light wavelength parameter can be related to the thickness of the layers, with thinner layers corresponding to shorter wavelengths. This can permit a reduced aspect ratio and a reduced minimum feature size.

In one embodiment, various chemicals may be used for permanently giving the build-up (for example, ILD), spacer, and/or metal layers the desired property variations. The chemicals can include but not be limited to poly(methyl methacrylate) (PMMA), poly(methyl glutarimide) (PMGI), phenol formaldehyde resin (DNQ/Novolac), and SU-8. In one embodiment, chemicals can be applied as a liquid and, generally, spin-coated to ensure uniformity of thickness.

In one embodiment, processing the build-up (for example, ILD), spacer, and/or metal layers can further include curing the layers using a heat source. The heat source can generate heat of a predetermined temperature of approximately 120° C. to approximately 140° C. in approximately 45 minutes. In one embodiment, the heat source can comprise an oven. The oven can have a temperature uniformity of approximately ±0.5% of the predetermined temperature. Moreover, the oven can comprise low particulate environmental controls to protect contamination, for example, using HEPA filtration of the air inside the oven. In one embodiment, the HEPA filter use can produce Class 10 (ISO Class 4) air quality. Moreover, the oven can be configured to have low oxygen levels to prevent oxidation of any of the layers.

In various embodiments, the interconnects, as described herein, may be used in connection with one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (for example, Sandy Bridge®, Ivy Bridge®, Haswell®, Broadwell®, Skylake®, etc.).

Additionally or alternatively, the interconnects, as described herein, may be used in connection with one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In some embodiments, the electronic device in which the interconnects is used and/or provided may be a computing device. Such a computing device may house one or more boards on which the interconnects may be disposed. The board may include a number of components including, but not limited to, a processor and/or at least one communication chip. The processor may be physically and electrically connected to the board through, for example, electrical connections of the interconnects. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further embodiments, the computing device may be any other electronic device that processes data.

According to example embodiments of the disclosure, there may be an assembly. The assembly may comprise: a first layer having one or more interconnect lines formed in the first layer; a sacrificial member disposed on the etch stop layer; a spacer member abutting the sacrificial member and a first portion of the etch stop layer, wherein the spacer member masks a second portion of the etch stop layer and a second portion of the first layer; a second layer disposed on a third portion of the second etch stop layer; and a gap defined by two adjacent interconnect lines of the one or more interconnect lines and a portion of the second layer.

Implementation may include one or more of the following features. The spacer layer of the assembly may comprise a metal oxide. The at least one gap may comprise a dielectric material. At least one of the non-conformal second layer or the first layer may comprise an interlayer dielectric. The gap may comprise an air gap. The spacer layer of the assembly may have a thickness of about one half the spacing between adjacent interconnect lines of the one or more interconnect lines. The one or more interconnect lines may comprise one or more metal interconnect lines. The non-conformal second layer may have a thickness of about 30 nm to 60 nm.

According to example embodiments of the disclosure, there may be a method. The method may comprise: providing a first layer having one or more interconnect lines formed in the first layer; providing an etch stop layer disposed on the one or more interconnect lines and the first layer; providing a sacrificial member disposed on the etch stop layer; providing a spacer layer disposed on the sacrificial member and the etch stop layer; removing a portion of the spacer layer and a first portion of the etch stop layer, wherein the removal of the portion of the spacer layer yields a spacer member masking a second portion of the etch stop layer and a first portion of the first layer; removing a second portion of the first layer unmasked by the spacer member, and the etch stop layer between two adjacent interconnect lines of the one or more interconnect lines; providing a second etch stop layer disposed on a subset of the one or more interconnect lines, a third portion of the first layer, the sacrificial member, and the spacer member; providing a second layer disposed on a portion of the second etch stop layer forming a gap; removing a portion of the second layer; and removing the sacrificial member to form a void.

Implementation may include one or more of the following features. The method of removing the portion of the space layer may further comprise maskless etching of the space layer. Removing a second portion of the first layer unmasked by the spacer member, and the etch stop layer may further comprises maskless etching the second portion of the first layer and the etch stop layer. Providing a sacrificial member may comprise depositing the sacrificial member by chemical vapor deposition (CVD) or plasma enhanced chemical vapor deposition (PECVD). Removing the portion of the second layer may yield a third layer and the method may further comprise providing a second metal layer disposed on the third layer and the spacer member and at least partially filling of the void, wherein the second metal layer is coupled to at least one of the one or more interconnect lines.

According to example embodiments of the disclosure, there may be a method for fabricating an interconnect. The method for fabricating of an interconnect may comprise: providing a first layer having one or more interconnect lines formed in the first layer; providing a first directed self-assembly (DSA) material disposed on the one or more interconnect lines; providing a second DSA material disposed on a first portion of the first layer; removing a portion of the first DSA material to yield a trench; providing a sacrificial member disposed in the trench and on at least one of the one or more interconnect lines; removing the first DSA material and the second DSA material; providing an etch stop layer disposed on the first layer, and the one or more interconnect lines; providing a spacer layer disposed on the etch stop layer; removing the etch stop layer; removing a portion of the spacer layer, wherein the removal of the portion of the spacer layer yields a spacer member; removing a portion of the first layer not masked by the spacer member; providing an etch stop layer disposed on a first portion of the one or more interconnect lines, a second portion of the first layer, the spacer member, and the sacrificial member; providing a second layer disposed on a portion of the etch stop layer, the sacrificial member, and the spacer member, forming a gap; removing a portion of the second layer; and removing the sacrificial member to yield a void.

Implementation may include one or more of the following features. Removing a portion of the spacer lay may further comprise a maskless etching of the portion of the spacer layer. Removing a portion of the first layer not masked by the spacer member and the etch stop layer not masked by the spacer member may further comprise maskless etching the portion of the first layer and the etch stop layer. The spacer lay may be deposited by chemical vapor deposition (CVD), plasma enhanced chemical vapor deposition (PECVD), or spin coating. The method may further comprise a second metal layer disposed on the third layer and the spacer member and at least partially filling the void, wherein the second metal layer is coupled to at least one of the one or more interconnect lines.

According to example embodiments of the disclosure, there may be an electronic device. The electronic device may comprise an assembly which may comprise: a first layer having one or more interconnect lines formed in the first layer; a sacrificial member disposed on the etch stop layer; a spacer member abutting the sacrificial member and a first portion of the etch stop layer, wherein the spacer member masks a second portion of the etch stop layer and a second portion of the first layer; a second layer disposed on a third portion of the second etch stop layer; and a gap defined by two adjacent interconnect lines of the one or more interconnect lines and a portion of the second layer.

Implementation may include one or more of the following features. The spacer layer of the assembly which may comprise the electronic device may comprise a metal oxide. The at least one gap may comprise a dielectric material. At least one of the non-conformal second layer or the first layer may comprise an interlayer dielectric. The gap may comprise an air gap. The spacer layer of the assembly which may comprise the electronic device may have a thickness of about one half the spacing between adjacent interconnect lines of the one or more interconnect lines. The one or more interconnect lines may comprise one or more metal interconnect lines. The non-conformal second layer may have a thickness of about 30 nm to 60 nm. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An integrated circuit (IC) structure, comprising:
a plurality of first interconnect lines;
a via over, and in contact with, one of the first interconnect lines;
a second interconnect line over, and in contact with, the via;
a spacer member laterally adjacent to the via;
a dielectric material between ones of the first interconnect lines within a first region that is below the spacer member; and
a gap comprising air or other gas, the gap within a same plane as the dielectric material and between ones of the first interconnect lines within a second region that is not below the spacer member.

2. The IC structure of claim 1, wherein the spacer member comprises a metal oxide.

3. The IC structure of claim 1, further comprising a second dielectric material between the dielectric material and the spacer member, wherein the second dielectric material is also between the gap and ones of the first interconnect lines within the second region.

4. The IC structure of claim 3, wherein the second dielectric material is a conformal layer in contact with the first interconnect lines within the second region.

5. The IC structure of claim 1, wherein the gap comprises air.

6. The IC structure of claim 1, wherein the spacer member has a thickness of about one half the spacing between adjacent ones of the first interconnect lines.

7. The IC structure of claim 3, further comprising a third dielectric material adjacent to, and in contact with, the spacer member, and wherein the third dielectric material extends over the gap.

8. The IC structure of claim 7, wherein the second interconnect line is over the third dielectric material, and wherein, within the second region, the second dielectric material is between ones of the first interconnect lines and the third dielectric material.

9. A method, comprising:
receiving one or more interconnect lines within a first dielectric material;
forming a second dielectric material on the one or more interconnect lines and over the first dielectric material;
forming a sacrificial member on the second dielectric material;
forming a spacer layer on the sacrificial member and on the second dielectric material;
removing a portion of the spacer layer to form a spacer member;
removing a portion of the first dielectric material not masked by the spacer member;
forming a gap comprising air or another gas between adjacent ones of the first interconnect lines;
forming a third dielectric material over the first interconnect lines, and over the gap;
etching a trench into the third dielectric material, the trench exposing the sacrificial member;
removing the sacrificial member to form a void exposing one of the first interconnect lines; and
forming a second interconnect line and a via by depositing metal into the trench and into the void.

10. The method of claim 9, wherein removing the portion of the spacer layer further comprises maskless etching of the portion of the spacer layer.

11. The method of claim 9, wherein forming the sacrificial member comprises depositing the sacrificial member by chemical vapor deposition (CVD) or plasma enhanced chemical vapor deposition (PECVD).

12. A method for the fabrication of an interconnect, the method comprising:
providing one or more interconnect lines formed in the first layer; providing a first directed self-assembly (DSA) material disposed on the one or more interconnect lines;
providing a second DSA material disposed on a first portion of the first layer; removing a portion of the first DSA material to yield a trench;
providing a sacrificial member disposed in the trench and on at least one of the one or more interconnect lines;
removing the first DSA material and the second DSA material;
providing an etch stop layer disposed on the first layer, and the one or more interconnect lines;
providing a spacer layer disposed on the etch stop layer;
removing the etch stop layer;
removing a portion of the spacer layer, wherein the removal of the portion of the spacer layer yields a spacer member;
removing a portion of the first layer not masked by the spacer member;
providing an etch stop layer disposed on a first portion of the one or more interconnect lines, a second portion of the first layer, the spacer member, and the sacrificial member;

providing a second layer disposed on a portion of the etch stop layer, the sacrificial member, and the spacer member, forming a gap;

removing a portion of the second layer; and removing the sacrificial member to yield a void.

13. The method of claim 12, wherein removing a portion of the spacer layer further comprises a maskless etching of the portion of the spacer layer.

14. The method of claim 12, wherein removing a portion of the first layer not masked by the spacer member and the etch stop layer not masked by the spacer member further comprises maskless etching the portion of the first layer and the etch stop layer.

15. The method of claim 12, wherein the spacer layer is deposited by chemical vapor deposition (CVD), plasma enhanced chemical vapor deposition (PECVD), or spin coating.

16. The method of claim 12, further comprising providing a second metal layer disposed on the third layer and the spacer member and at least partially filling the void, wherein the second metal layer is coupled to at least one of the one or more interconnect lines.

* * * * *